US012382719B2

(12) United States Patent
Li et al.

(10) Patent No.: US 12,382,719 B2
(45) Date of Patent: Aug. 5, 2025

(54) POWER GATING DUMMY POWER TRANSISTORS FOR BACK SIDE POWER DELIVERY NETWORKS

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 17/937,431

(22) Filed: Sep. 30, 2022

(65) Prior Publication Data

US 2024/0113125 A1    Apr. 4, 2024

(51) Int. Cl.
*H10D 86/00*    (2025.01)
*B82Y 10/00*    (2011.01)
(Continued)

(52) U.S. Cl.
CPC ........... *H10D 86/00* (2025.01); *H01L 21/762* (2013.01); *H01L 21/76802* (2013.01);
(Continued)

(58) Field of Classification Search
CPC ............. H01L 21/762; H01L 21/76802; H01L 21/76897; H01L 21/76898; H01L 23/5286;
(Continued)

(56) References Cited

U.S. PATENT DOCUMENTS 9,331,062 B1    5/2016   Lane et al.
10,636,739 B2   4/2020   Beyne et al.
(Continued)

FOREIGN PATENT DOCUMENTS

CN    119998949 A    5/2025
EP     2884542 A2    6/2015
(Continued)

OTHER PUBLICATIONS

Zhuang, H. et al., "Dynamic Analysis of Power Delivery Network with Nonlinear Components Using Matrix Exponential Method"; Department of Computer Science & Engineering, University of California, CA USA, downloaded from the internet May 20, 2022, 5 pgs.
(Continued)

*Primary Examiner* — Sonya McCall-Shepard
(74) *Attorney, Agent, or Firm* — Samuel A. Waldbaum

(57) ABSTRACT

A semiconductor chip device includes a substrate with a back end of line layer and a backside power delivery network. An input power line is electrically coupled to the backside power delivery network. Dummy transistors are positioned in a circuit with analog or digital circuit elements. A power gating transistor is positioned in the circuit between the dummy transistors and the analog or digital circuit elements. Power from the power input line is provided from the backside power delivery network, through the dummy transistors, and controlled by the power gating transistor for transfer to the analog or digital circuit elements. The device uses a backside delivery of power to the area of the dummy transistors to transfer power into the analog or digital circuit elements, which leaves more of the front side footprint for functional devices.

7 Claims, 27 Drawing Sheets

(51) Int. Cl.
*H01L 21/762* (2006.01)
*H01L 21/768* (2006.01)
*H01L 23/528* (2006.01)
*H10D 30/01* (2025.01)
*H10D 30/43* (2025.01)
*H10D 30/67* (2025.01)
*H10D 62/10* (2025.01)
*H10D 62/17* (2025.01)
*H10D 64/23* (2025.01)
*H10D 84/01* (2025.01)
*H10D 84/03* (2025.01)
*H10D 84/83* (2025.01)
*H10D 84/85* (2025.01)
*H10D 86/01* (2025.01)

(52) U.S. Cl.
CPC ..... *H01L 23/5286* (2013.01); *H10D 84/0151* (2025.01); *H10D 84/038* (2025.01); *H10D 86/01* (2025.01)

(58) Field of Classification Search
CPC ............. H10D 30/0198; H10D 64/251; H10D 84/0149; H10D 84/0186; H10D 84/0128; H10D 62/364; H10D 62/121; H10D 30/6757; H10D 30/6735; H10D 30/43; H10D 30/014; H10D 84/85; H10D 86/00; H10D 84/0151; H10D 84/038; H10D 86/01; H10D 84/83
See application file for complete search history.

(56) References Cited

U.S. PATENT DOCUMENTS

| | | | |
|---|---|---|---|
| 11,004,789 | B2 | 5/2021 | Doornbos et al. |
| 12,057,371 | B2 | 8/2024 | Xie et al. |
| 2017/0373567 | A1 | 12/2017 | Nishizono |
| 2019/0051746 | A1 | 2/2019 | Togami |
| 2019/0305773 | A1 | 10/2019 | Olsen |
| 2019/0378836 | A1* | 12/2019 | Wang ............... H10D 30/62 |
| 2020/0303551 | A1* | 9/2020 | Chen ............ H01L 21/76871 |
| 2020/0373242 | A1 | 11/2020 | Hiblot et al. |
| 2021/0305130 | A1 | 9/2021 | Cho |
| 2021/0343646 | A1 | 11/2021 | Chen |
| 2022/0123751 | A1 | 4/2022 | Thyagarajan et al. |
| 2022/0230947 | A1 | 7/2022 | Park |
| 2024/0079476 | A1 | 3/2024 | Li et al. |

FOREIGN PATENT DOCUMENTS

| | | |
|---|---|---|
| EP | 3671859 A1 | 6/2020 |
| TW | 201816982 A | 5/2018 |
| TW | 202416489 A | 4/2024 |
| WO | 2024/068454 A1 | 4/2024 |

OTHER PUBLICATIONS

International Search Report and Written Opinion issued Dec. 18, 2023 is related application No. PCT/EP2023/076183, 11 pgs.

* cited by examiner

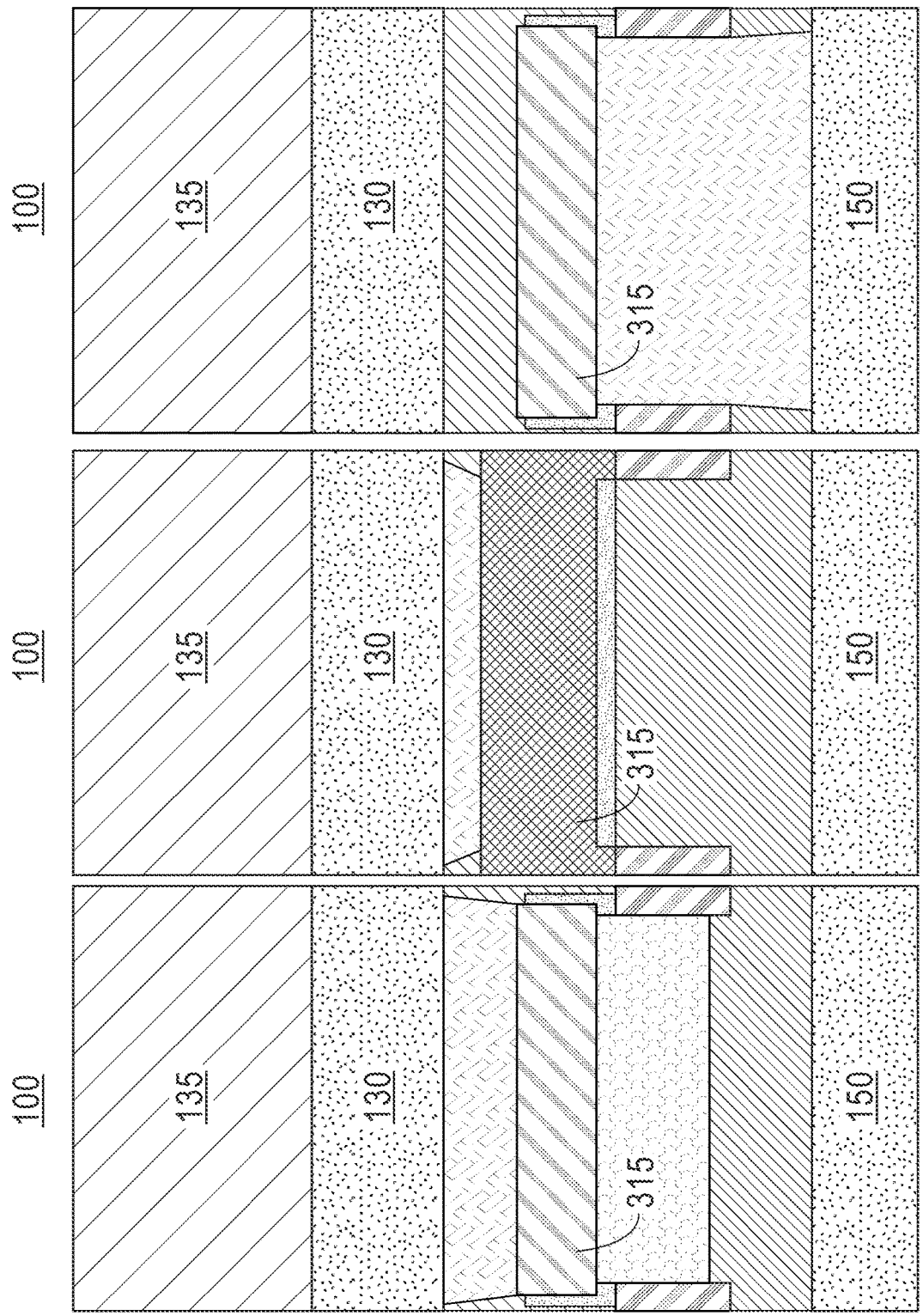

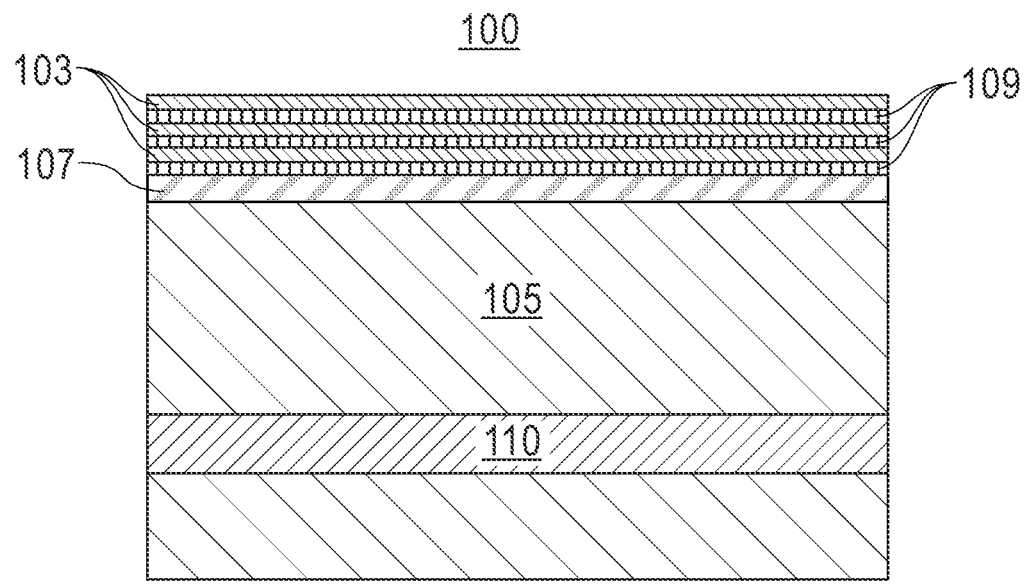
FIG. 3A
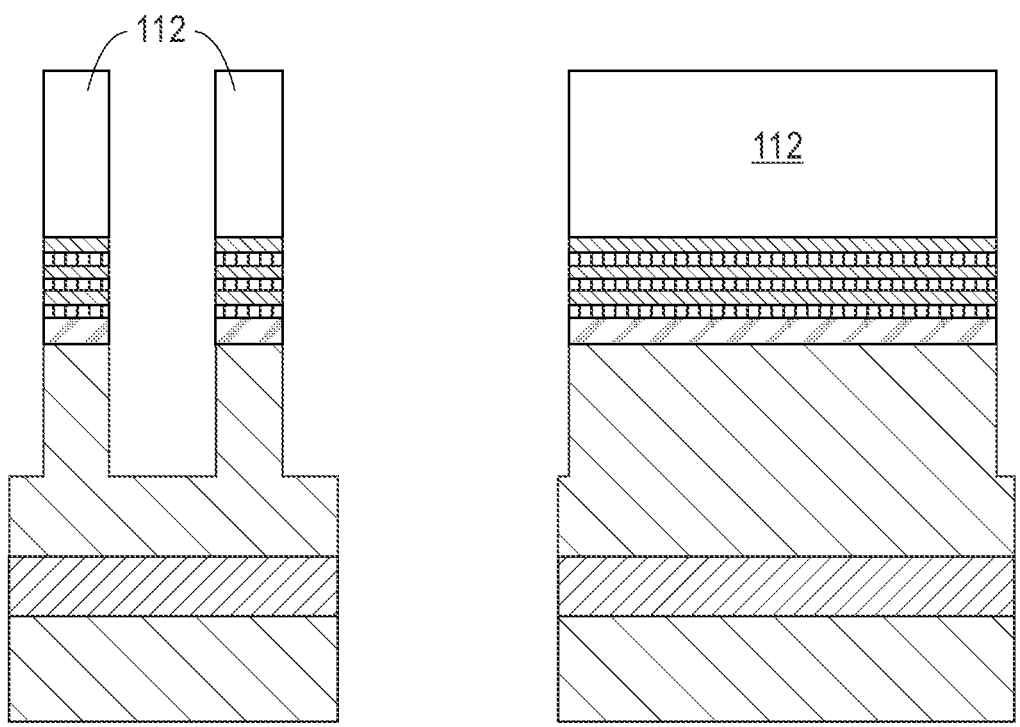
Section Y1 or Y6
FIG. 3B
Section Y3
FIG. 3C

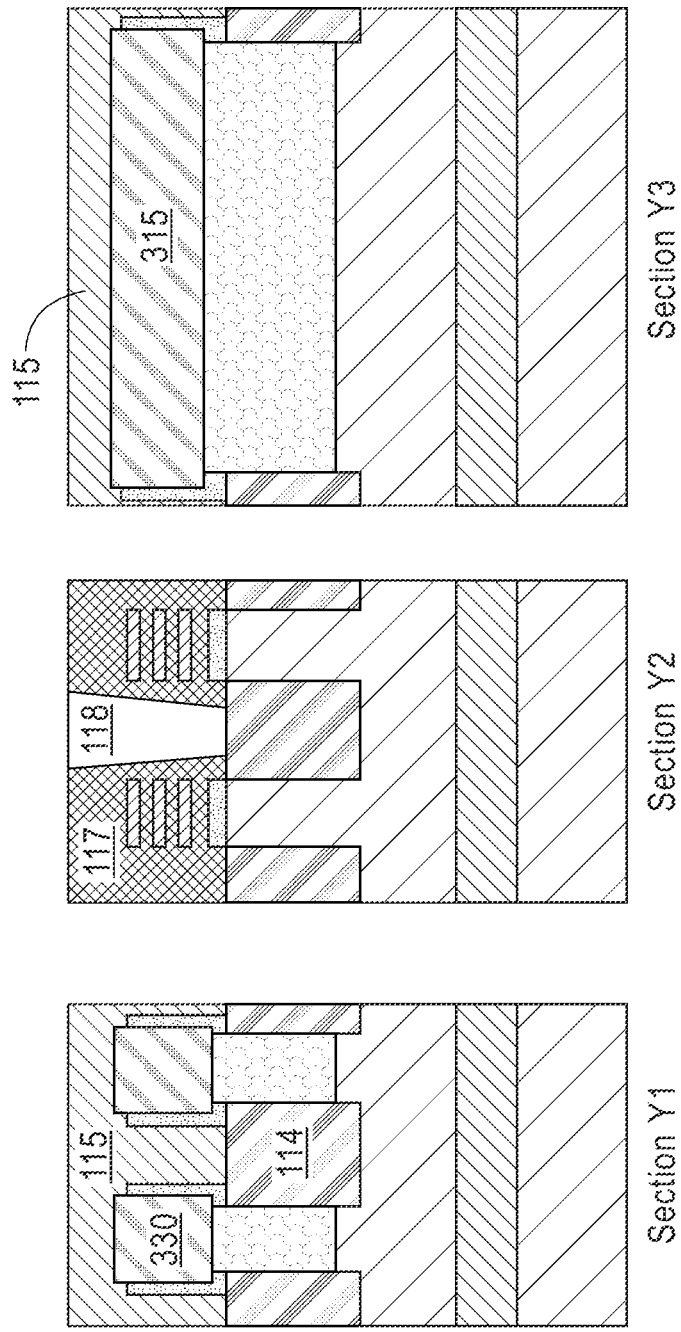

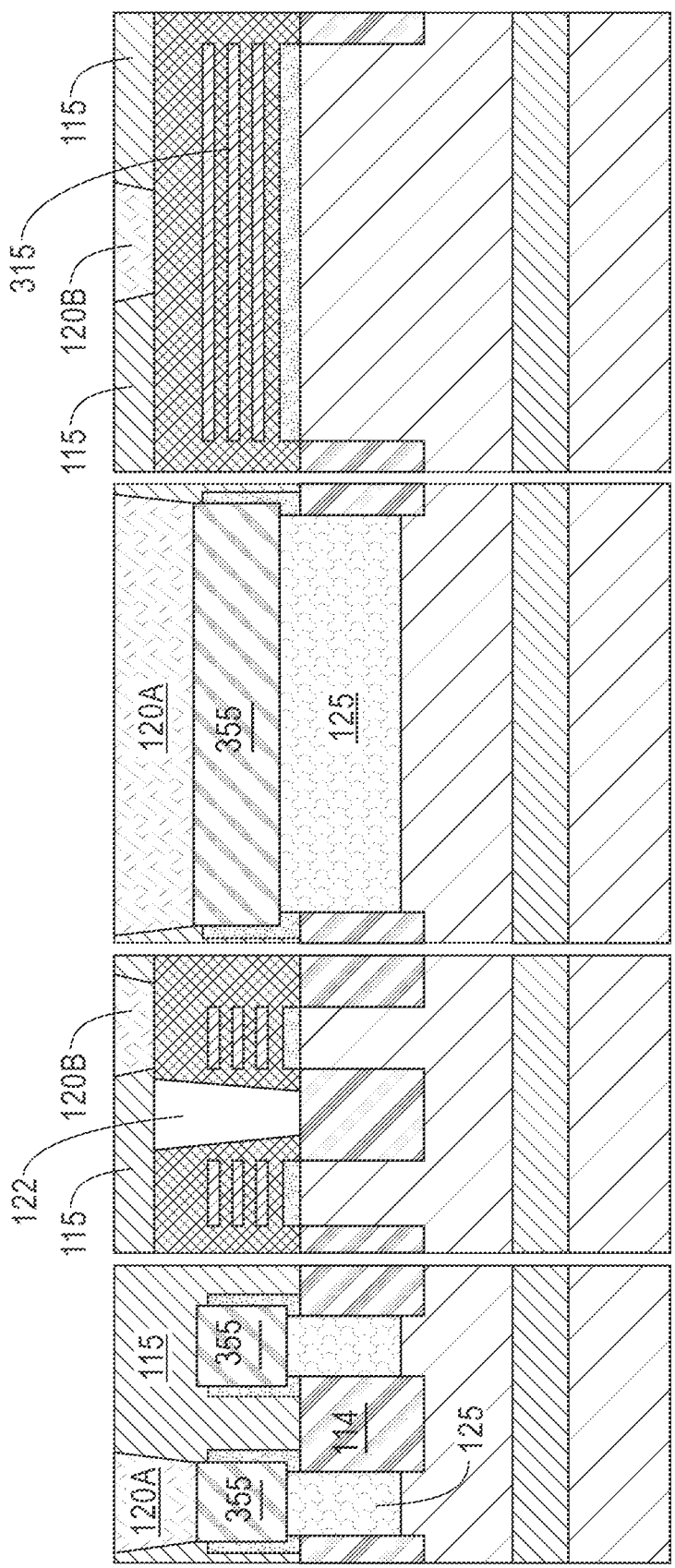
FIG. 6A Section Y1  FIG. 6B Section Y2  FIG. 6C Section Y3  FIG. 6D Section Y4

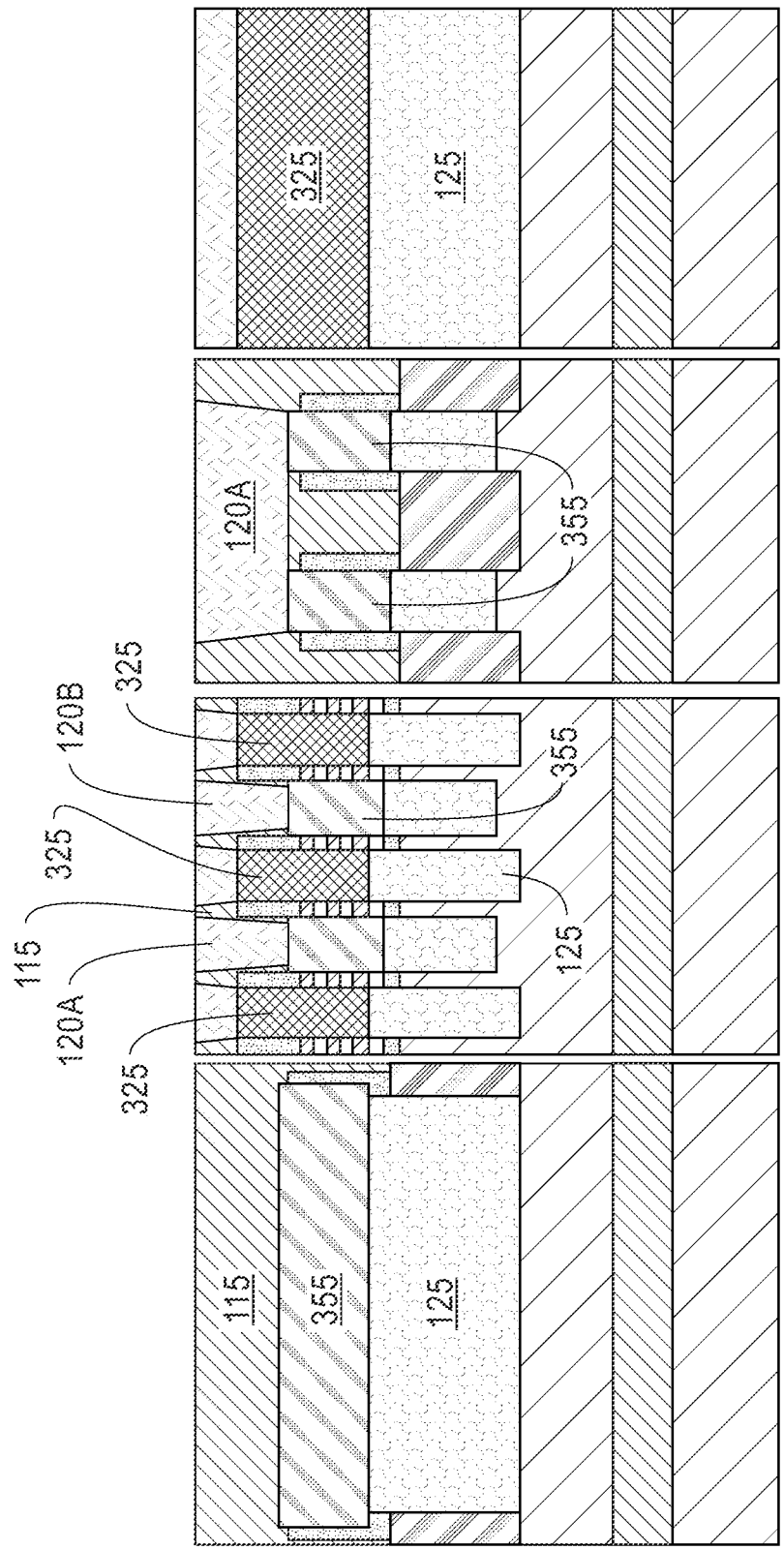

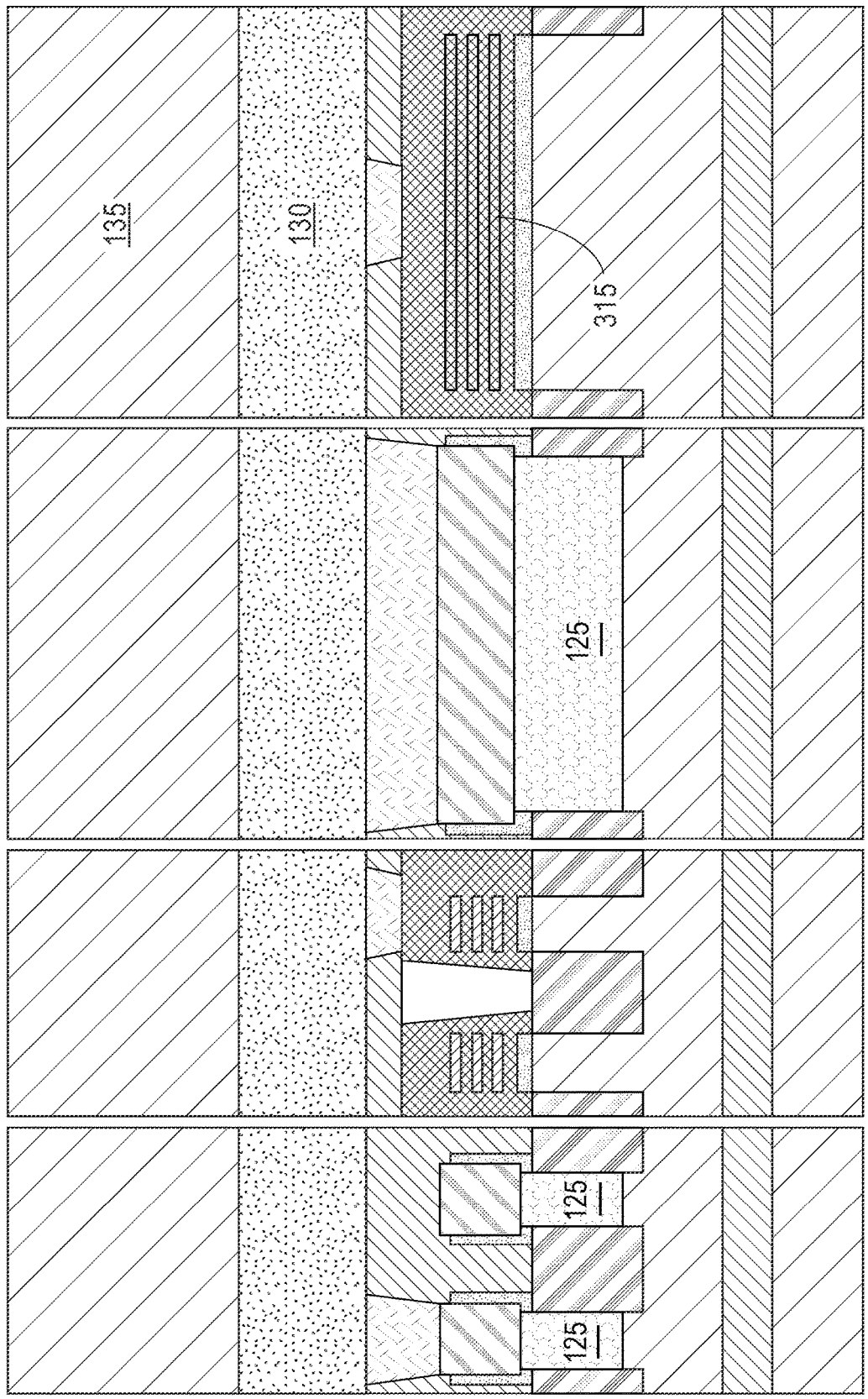

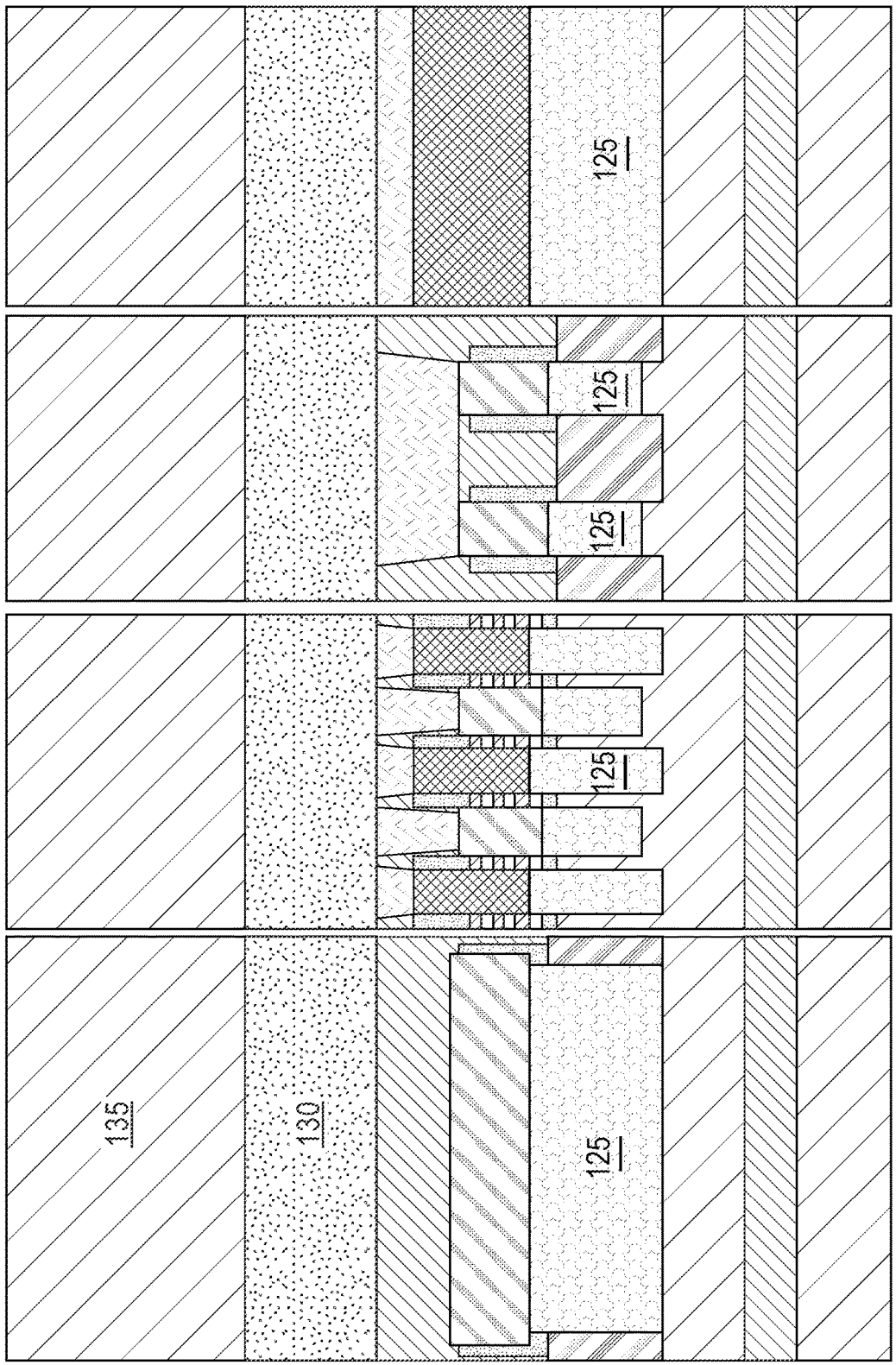

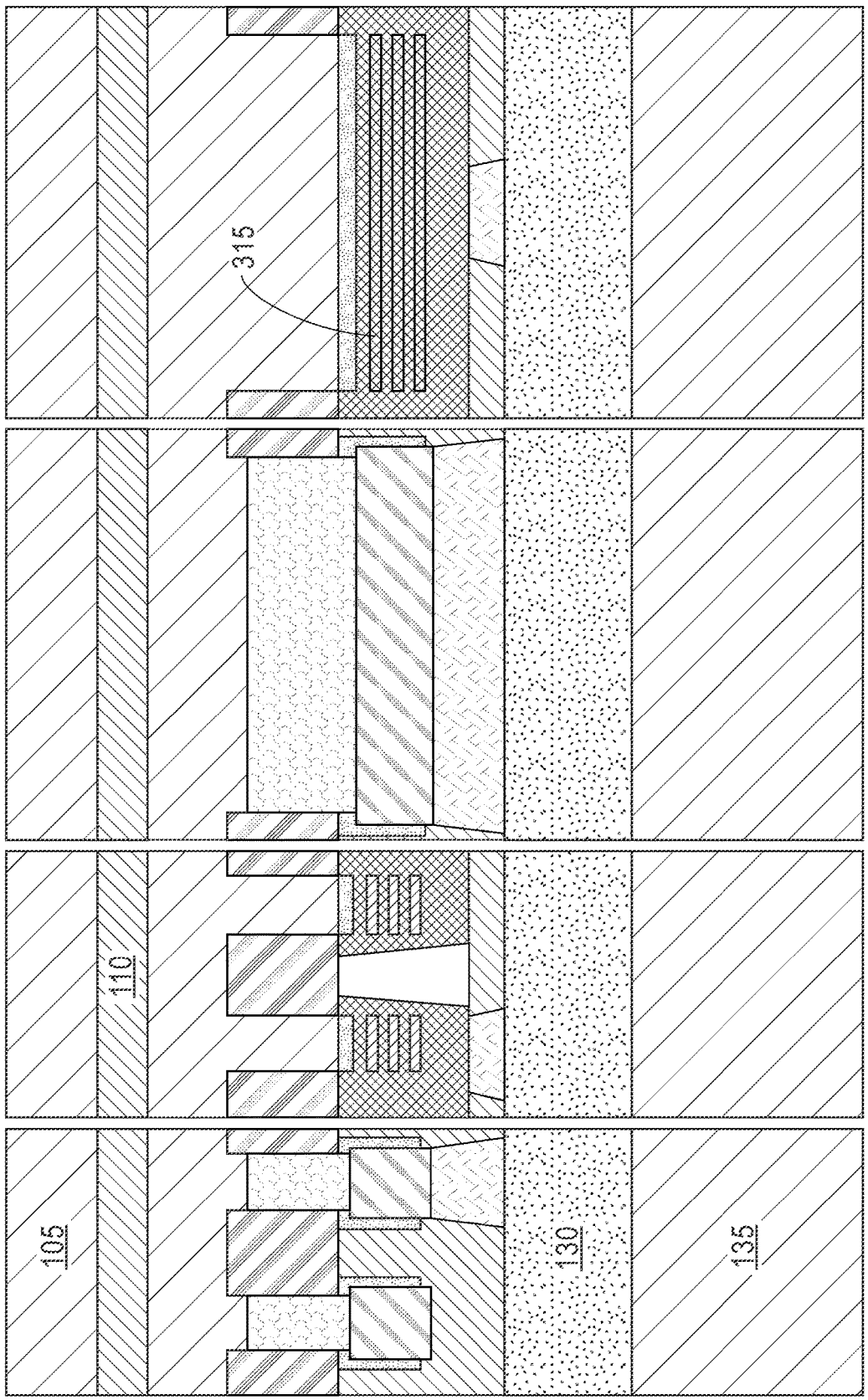

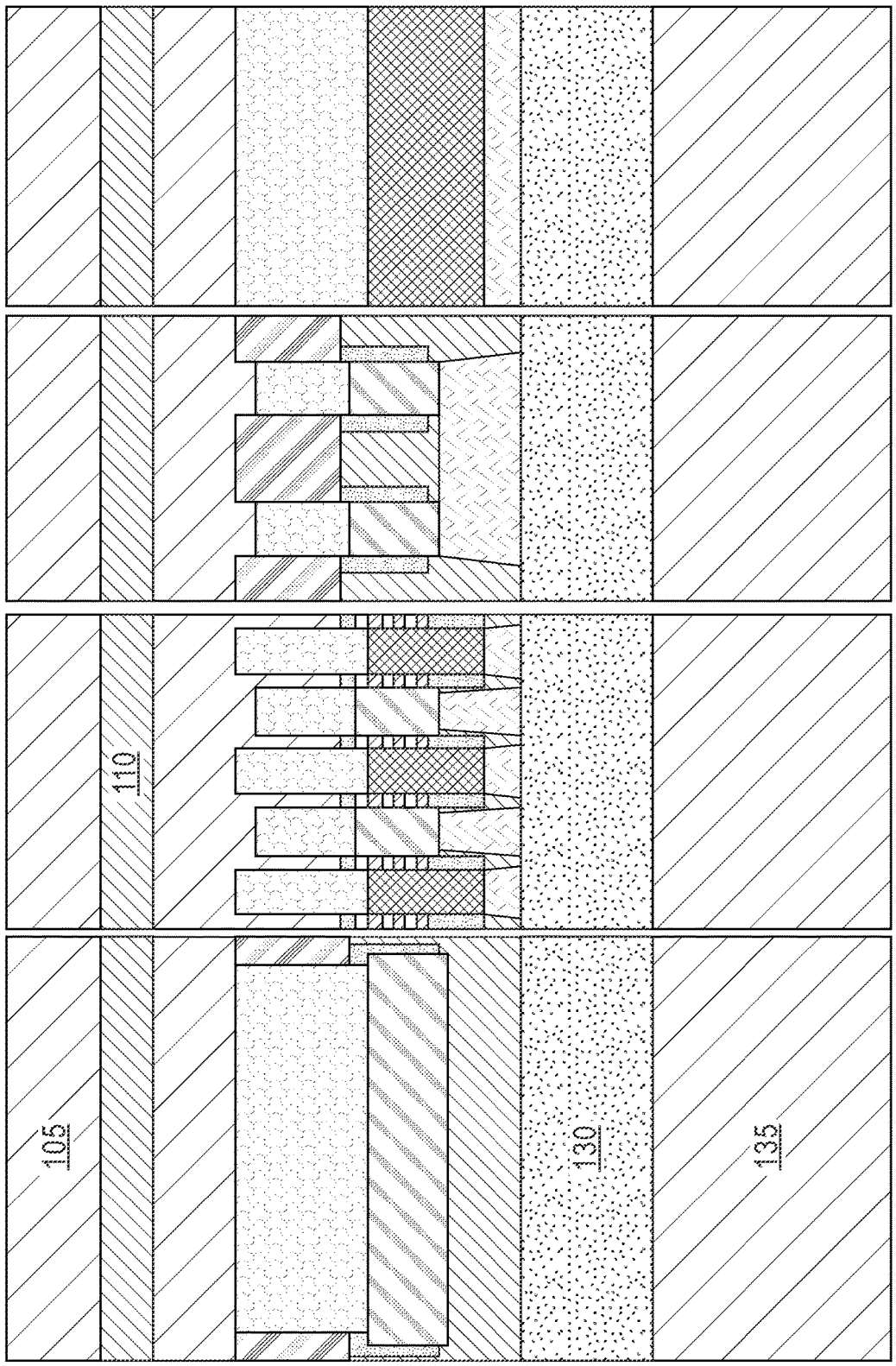

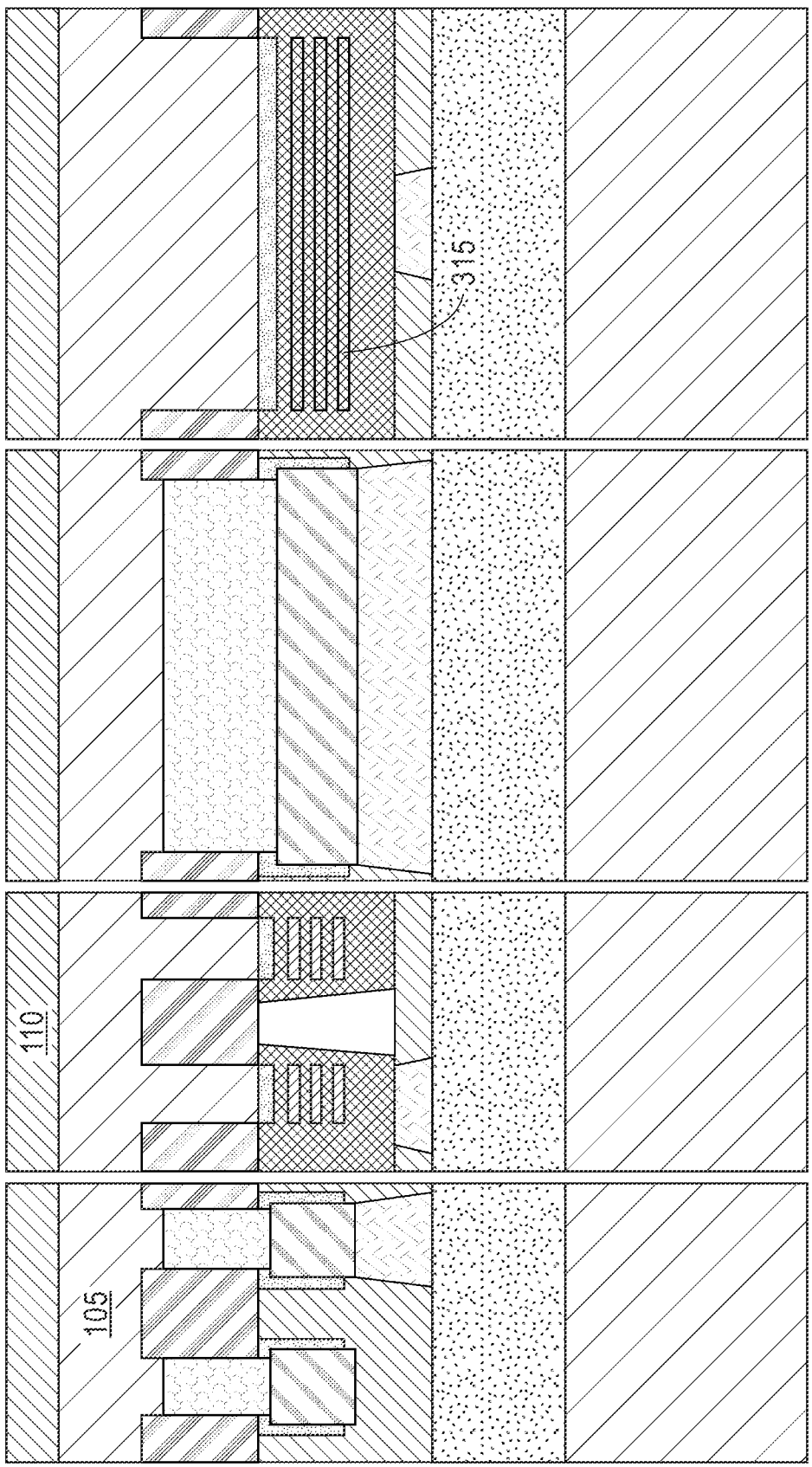

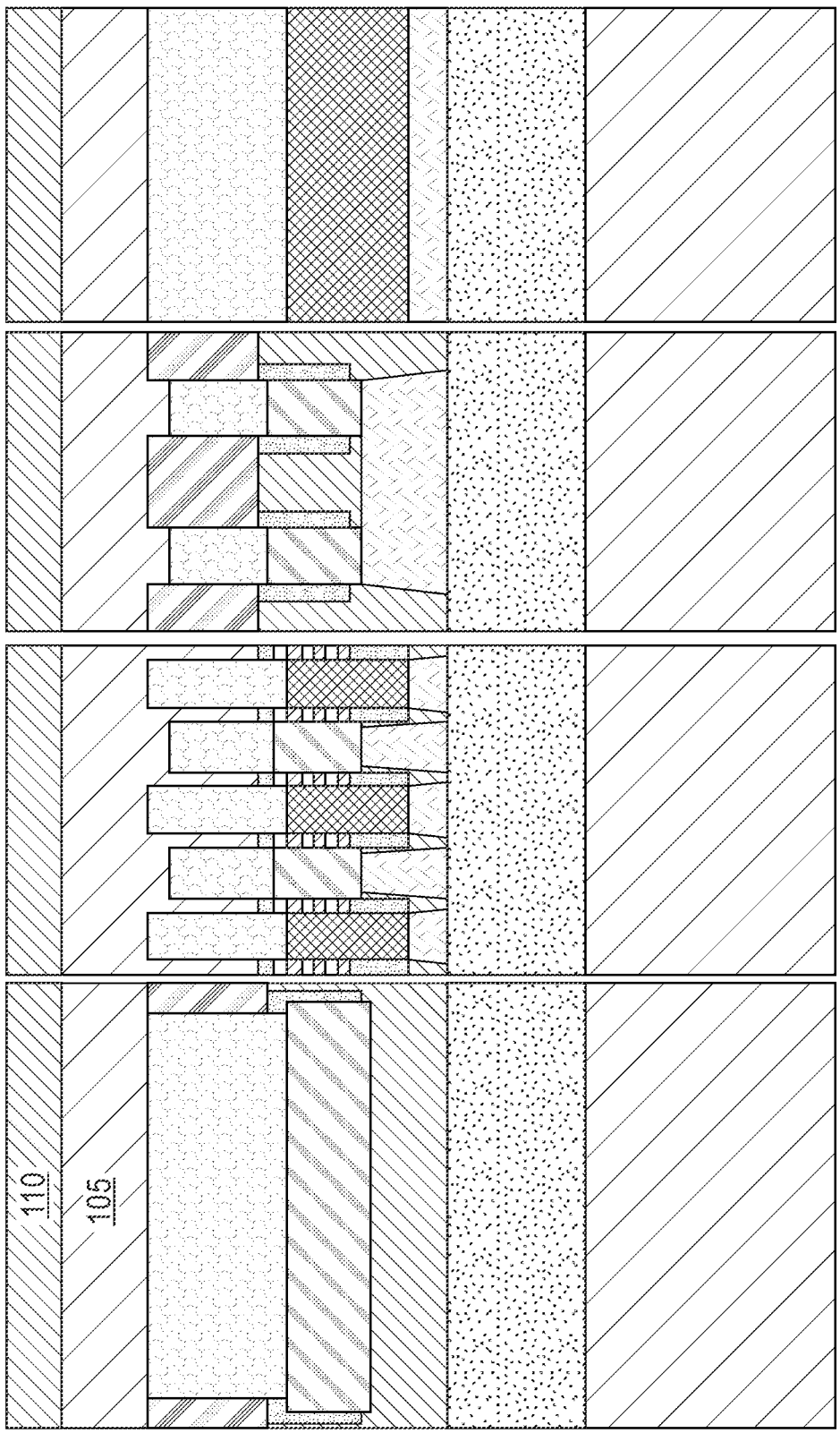

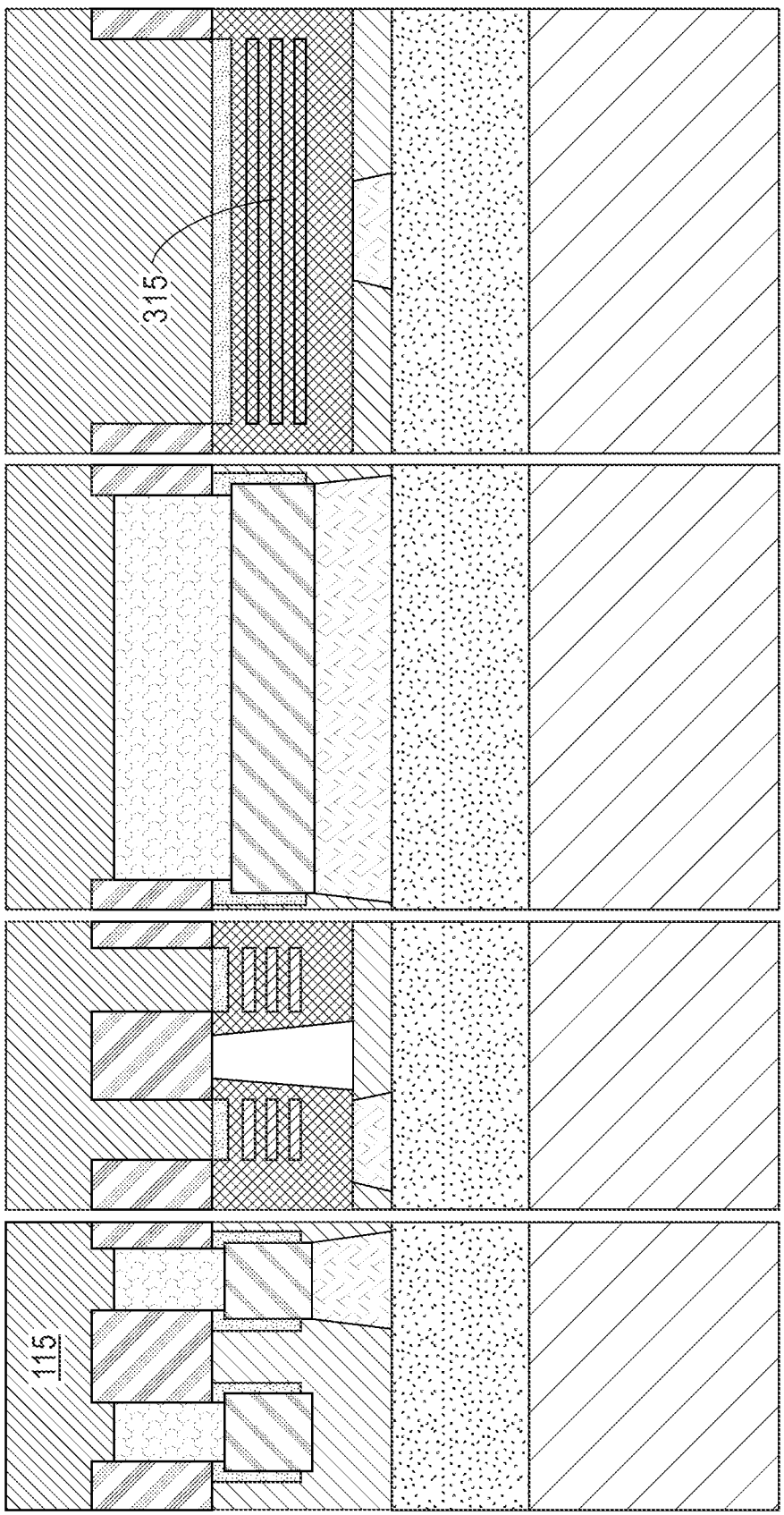

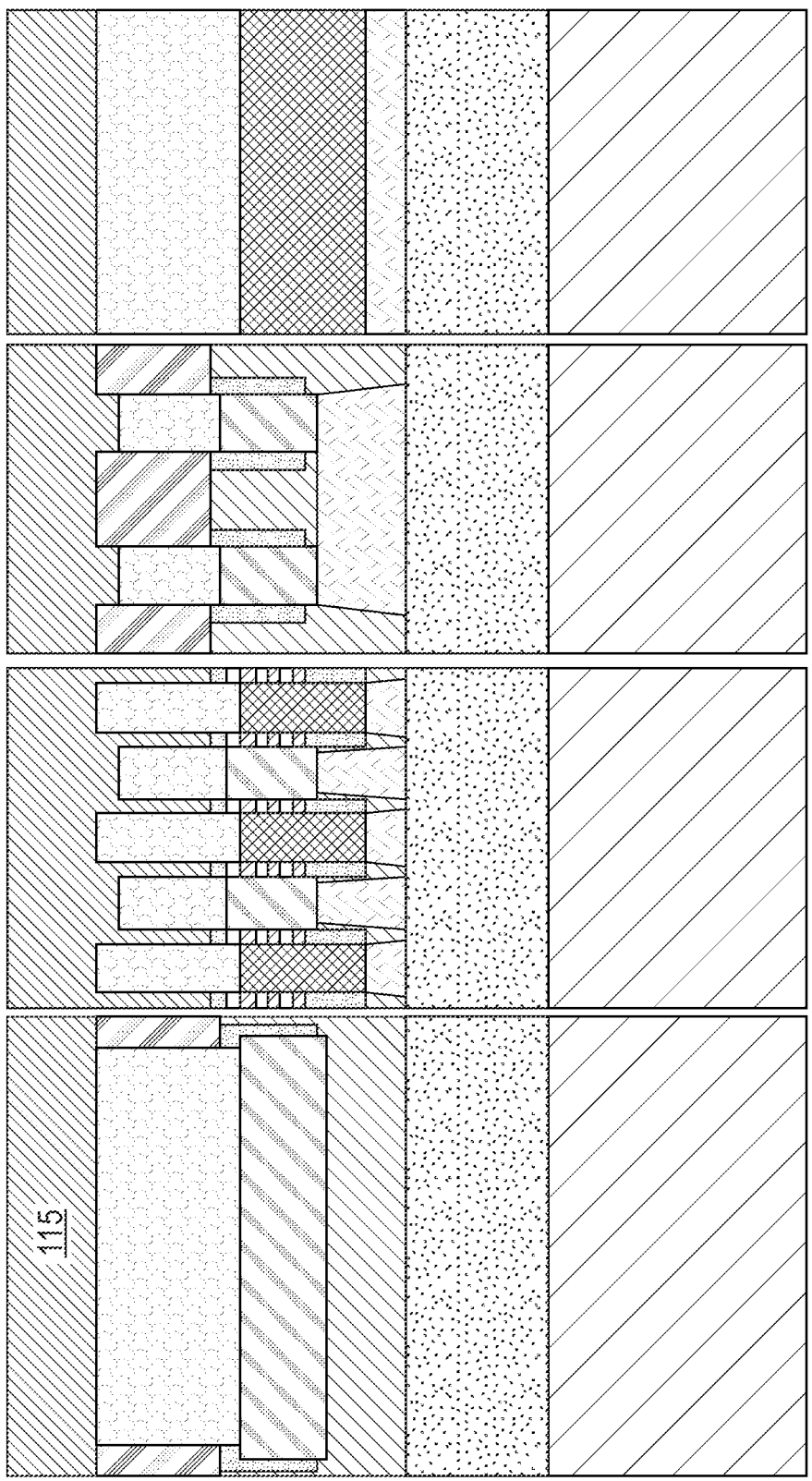

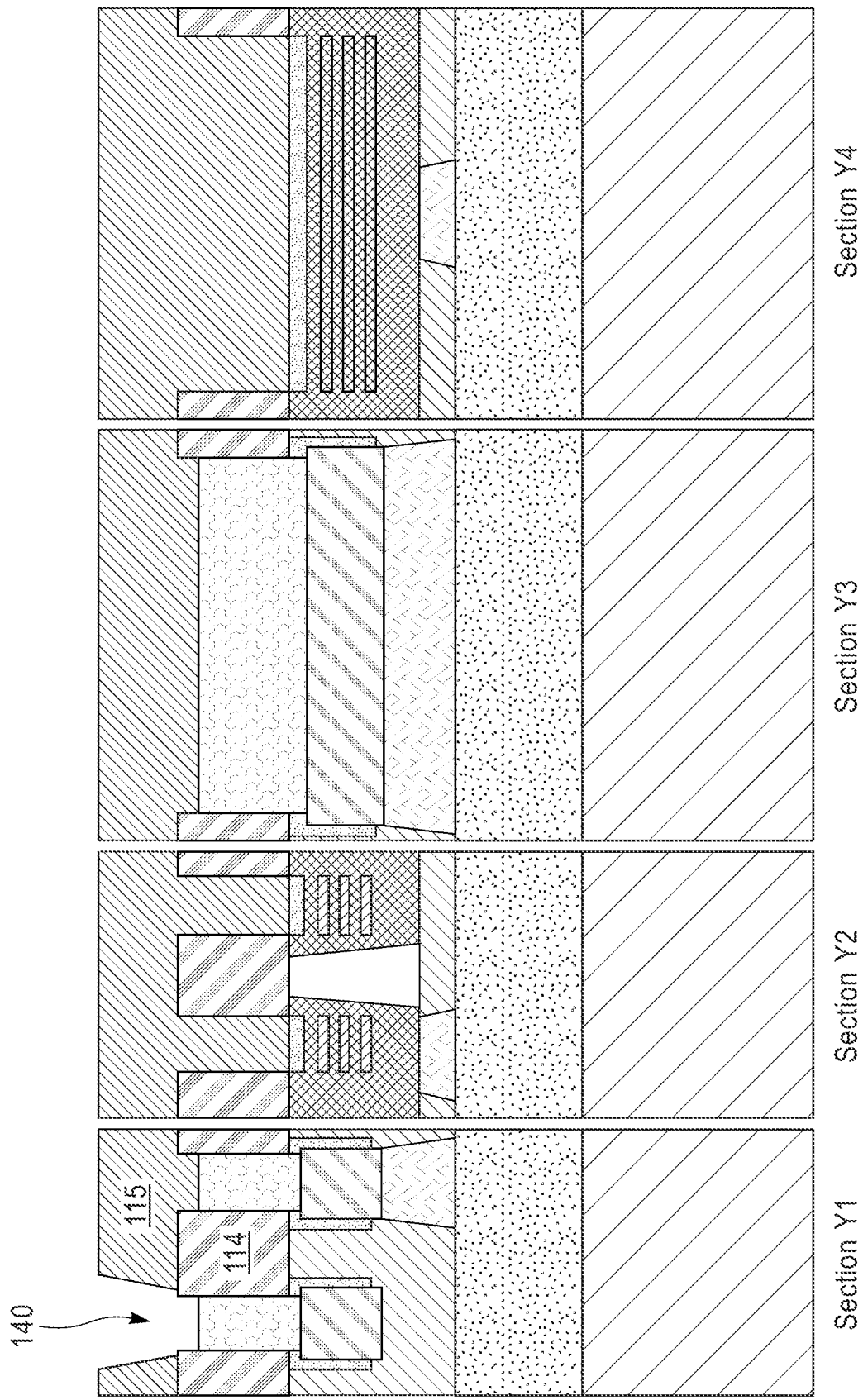

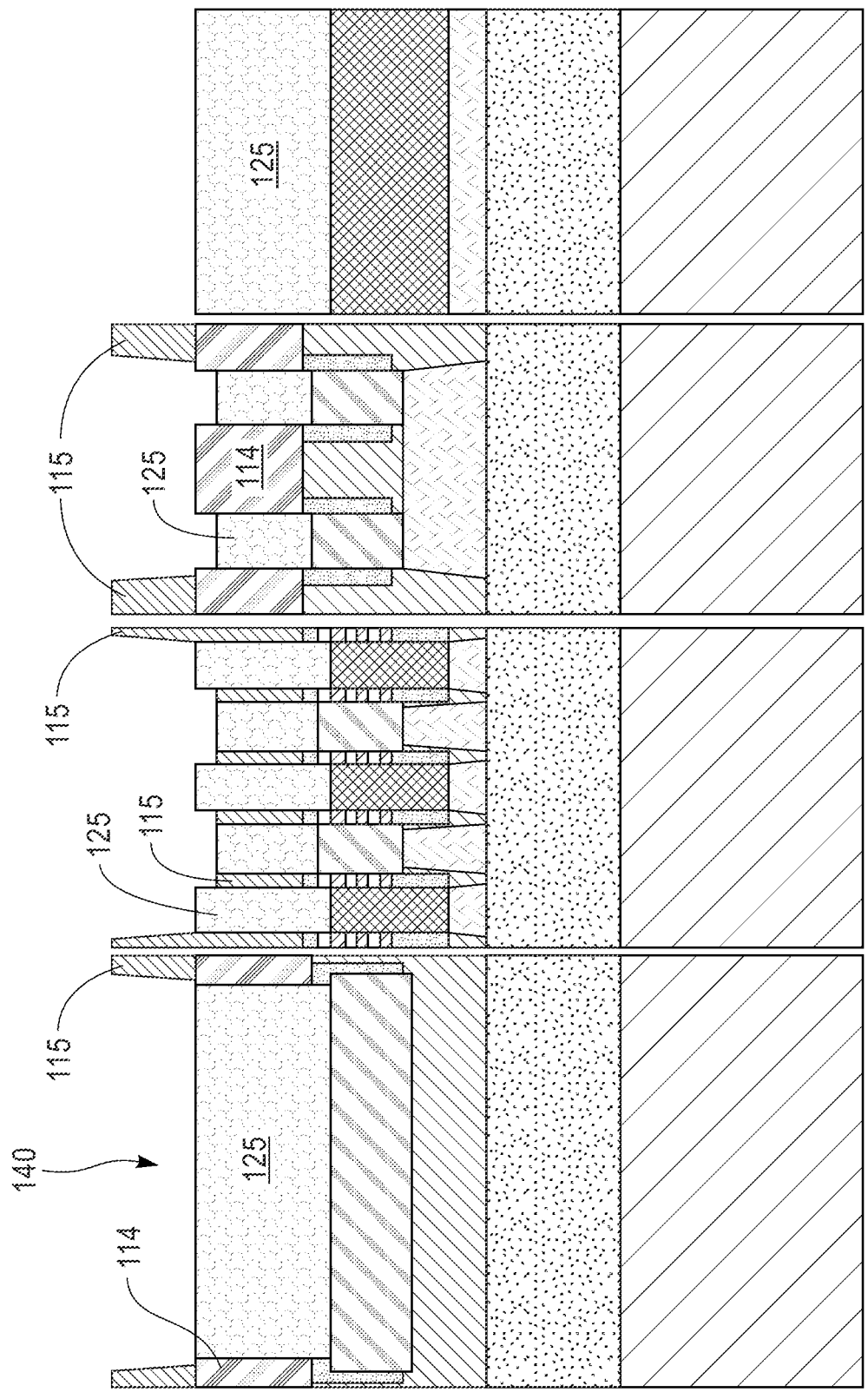

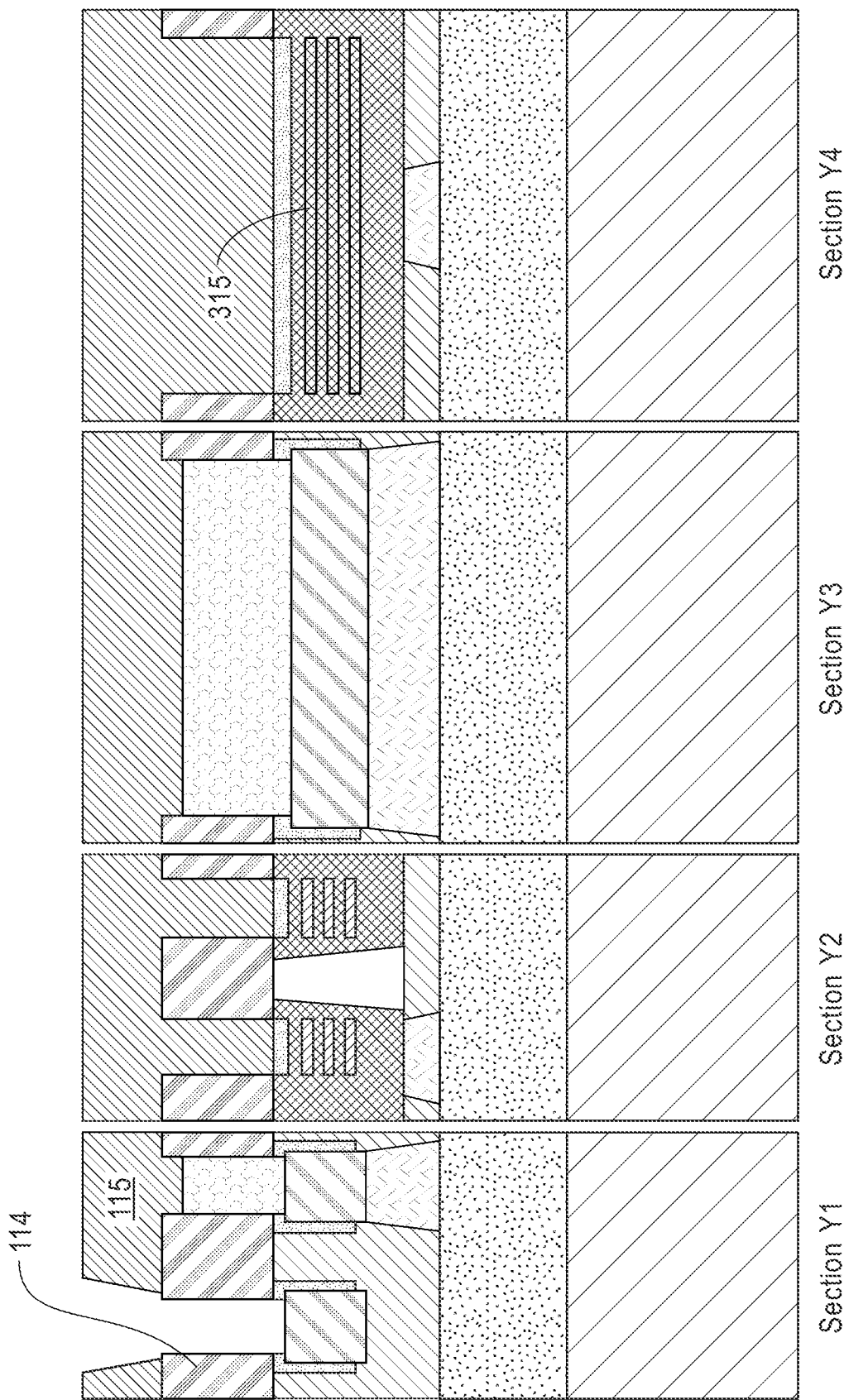

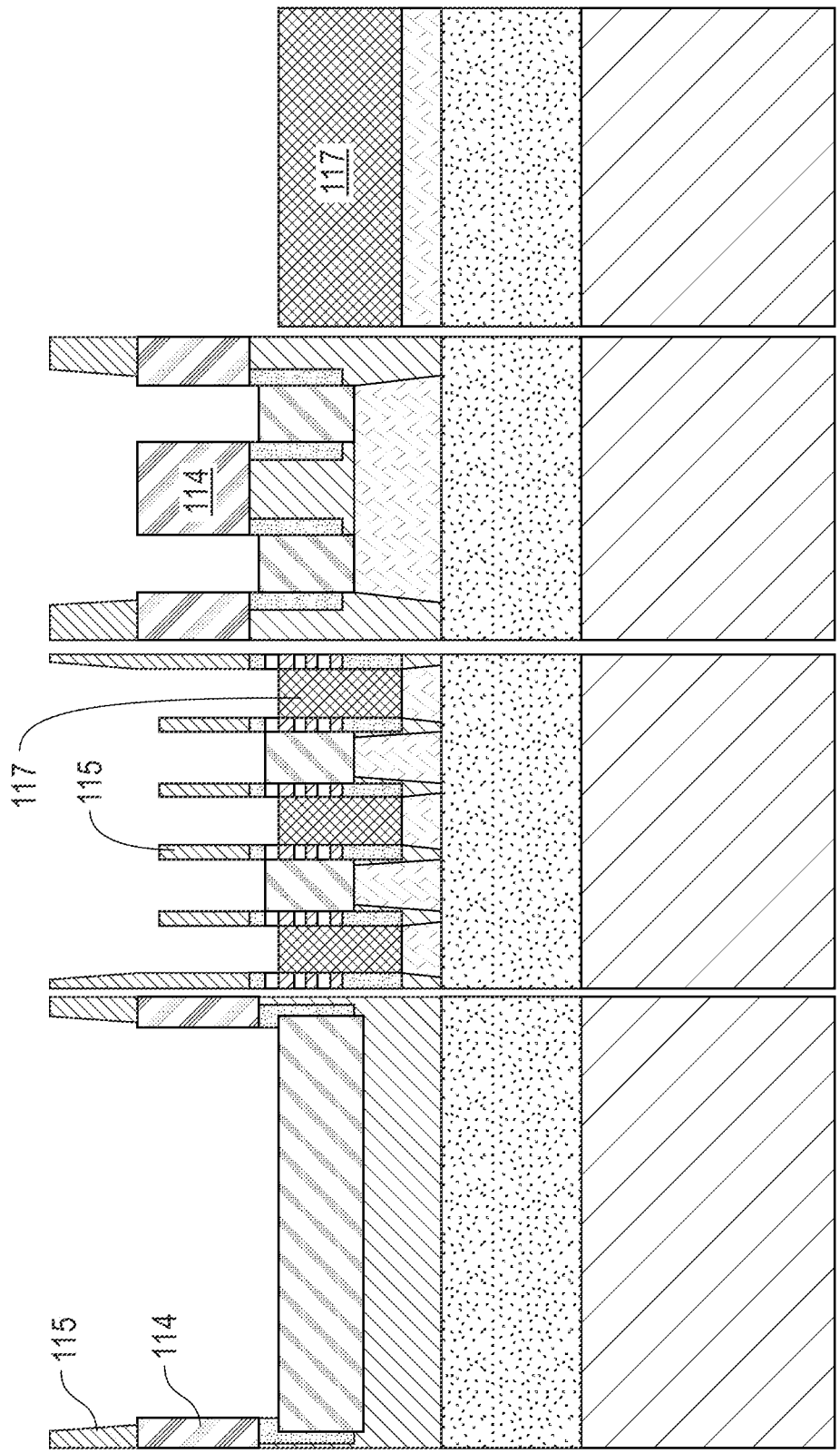

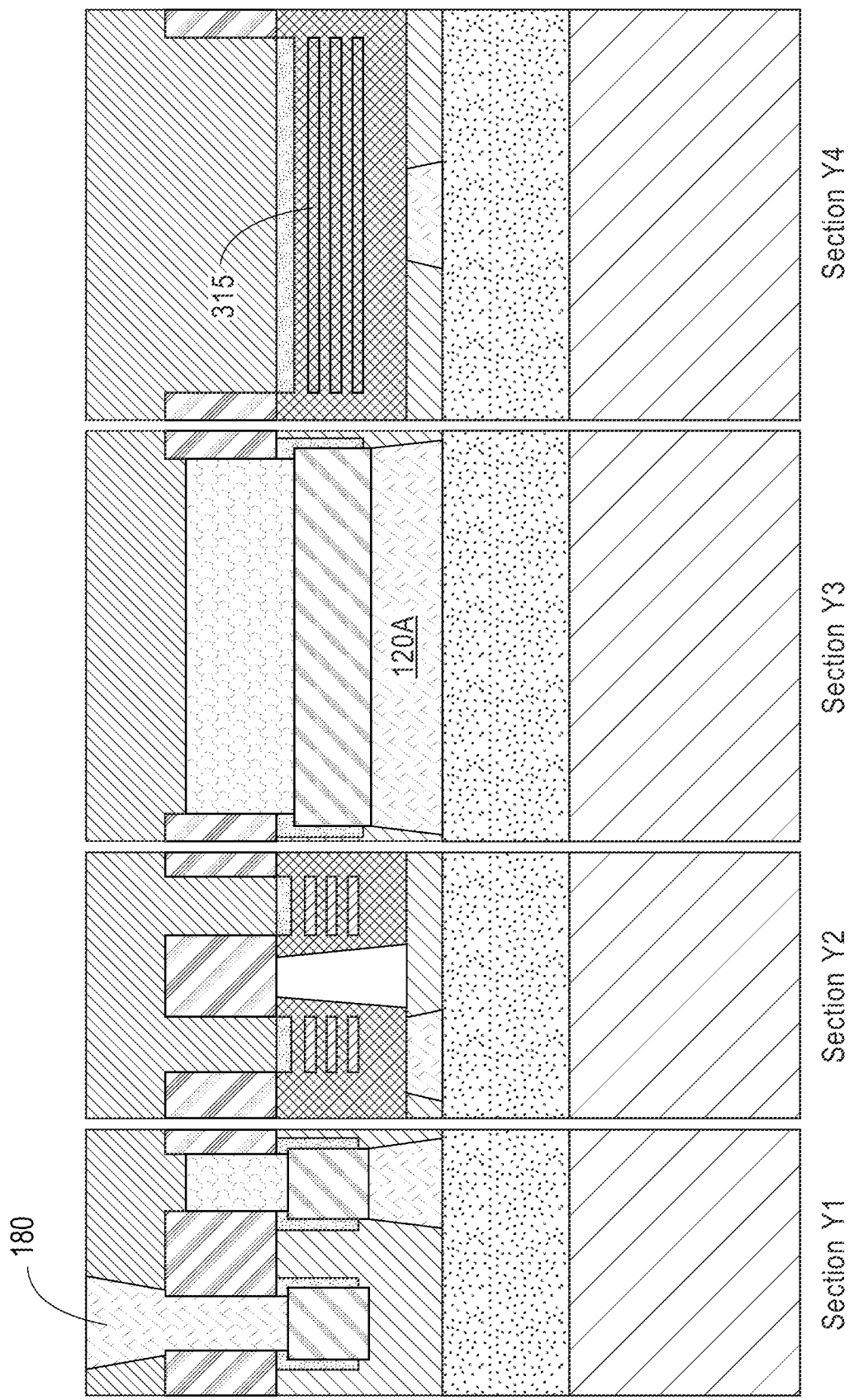
FIG. 13A Section Y1
FIG. 13B Section Y2
FIG. 13C Section Y3
FIG. 13D Section Y4

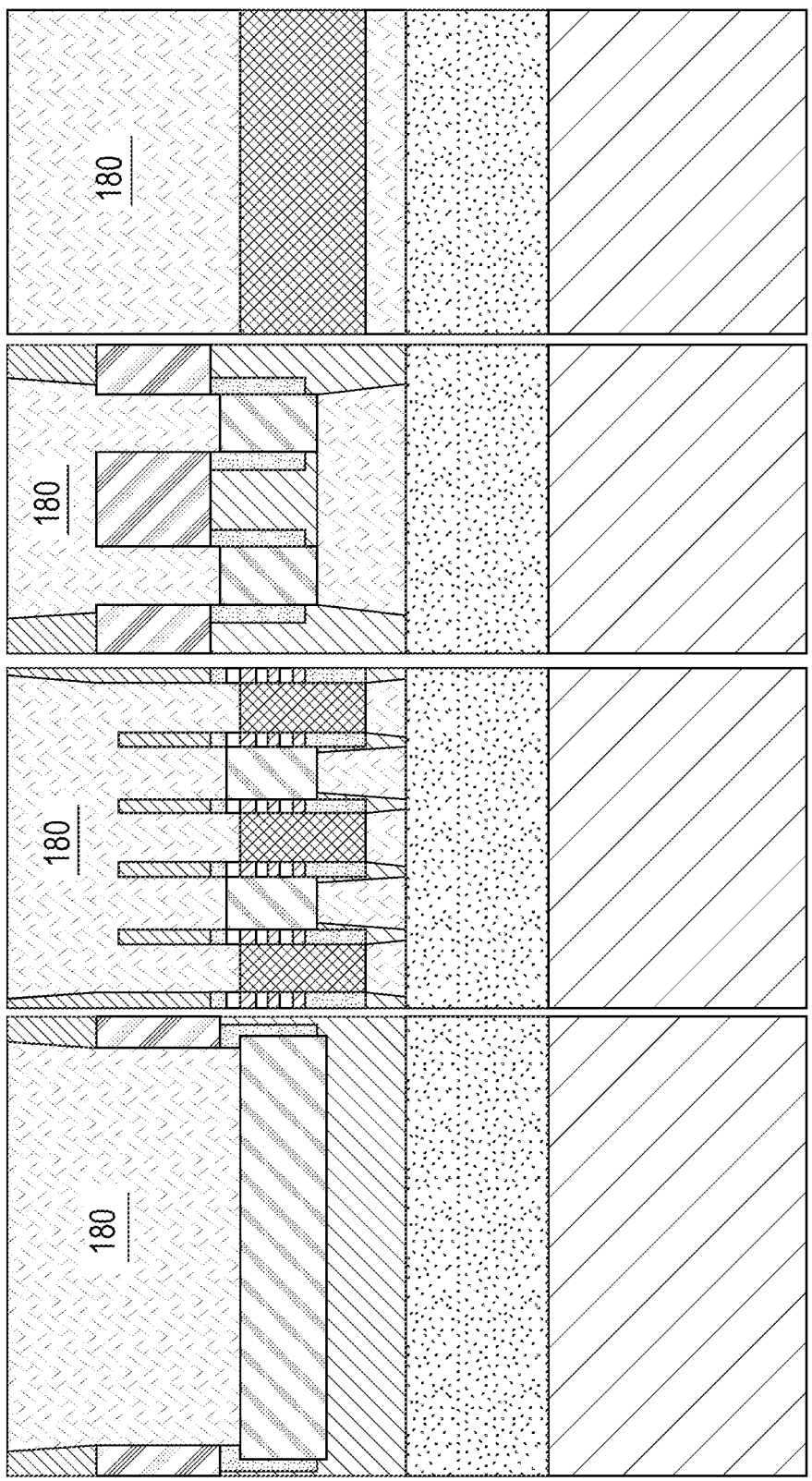
FIG. 13E Section Y5
FIG. 13F Section X1
FIG. 13G Section Y6
FIG. 13H Section Y7

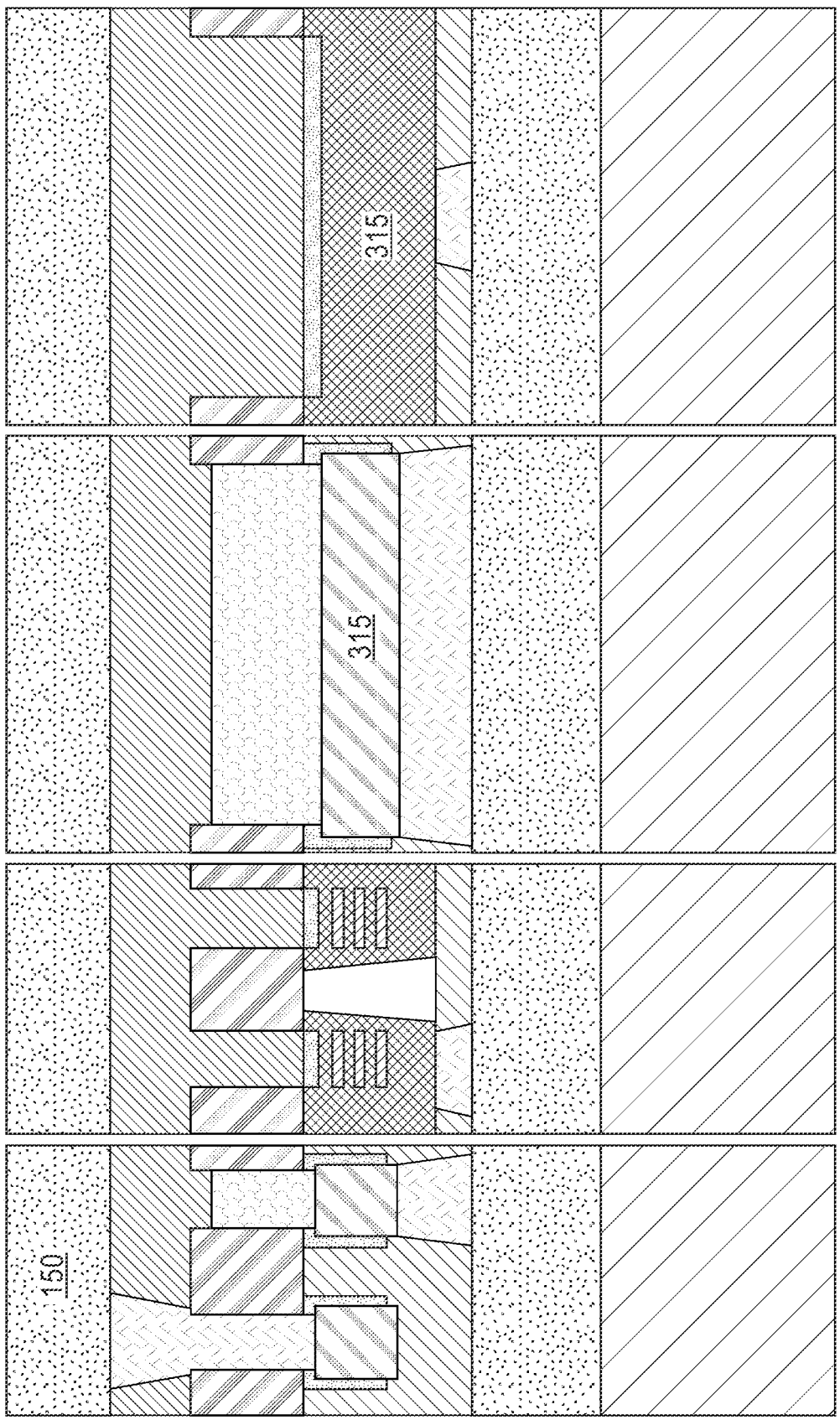

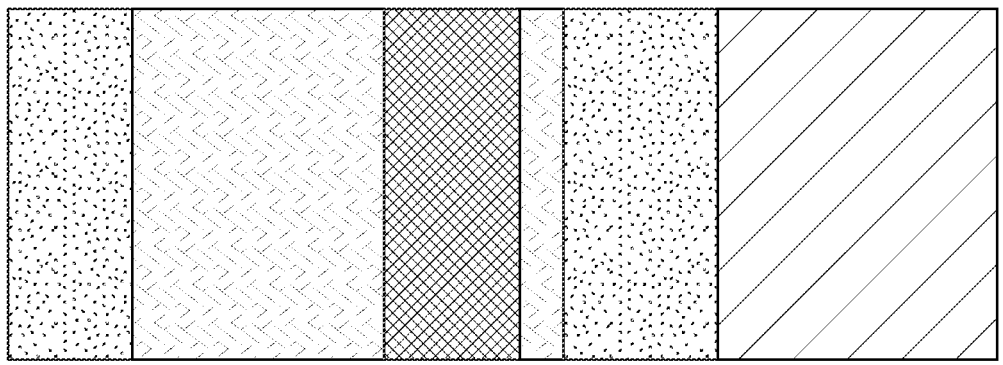
Section Y5  FIG. 14E
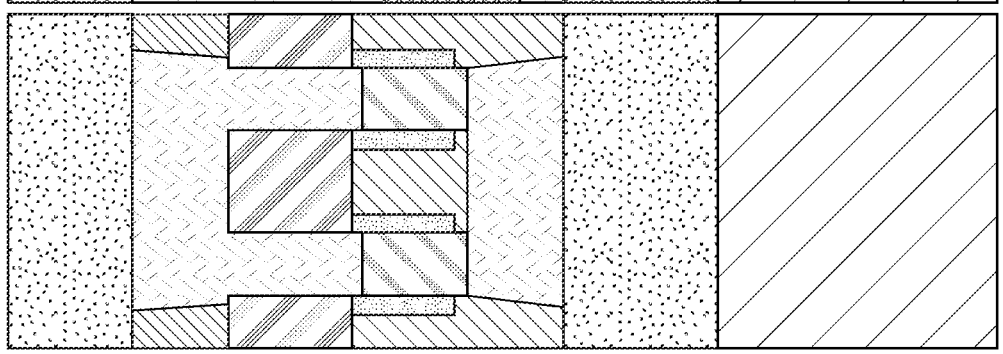
Section X1  FIG. 14F
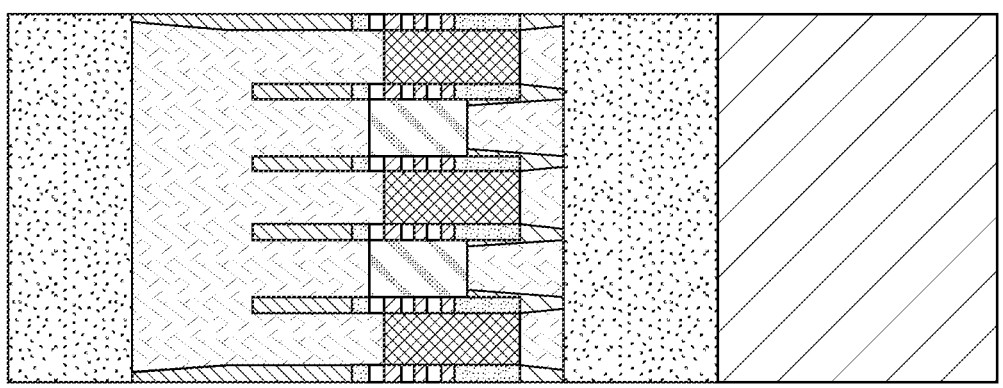
Section Y6  FIG. 14G
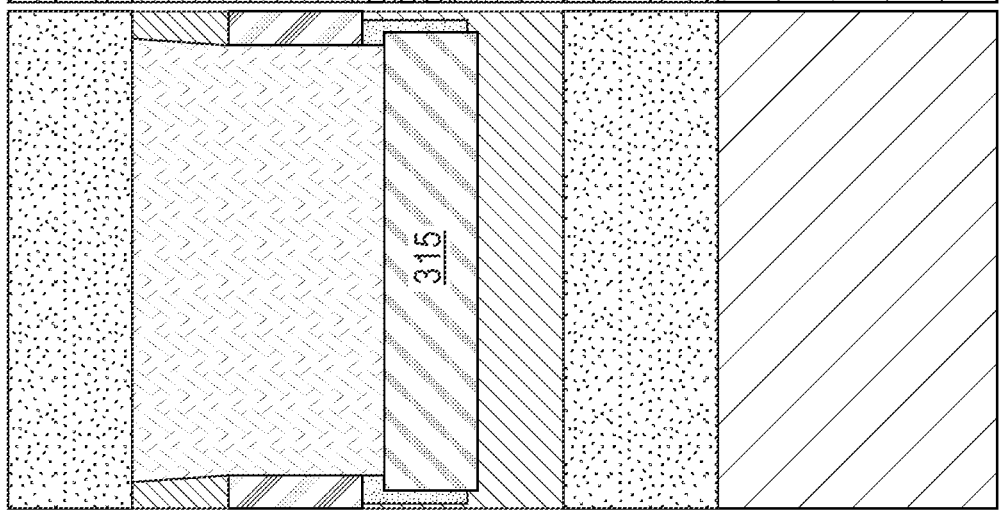
Section Y7  FIG. 14H

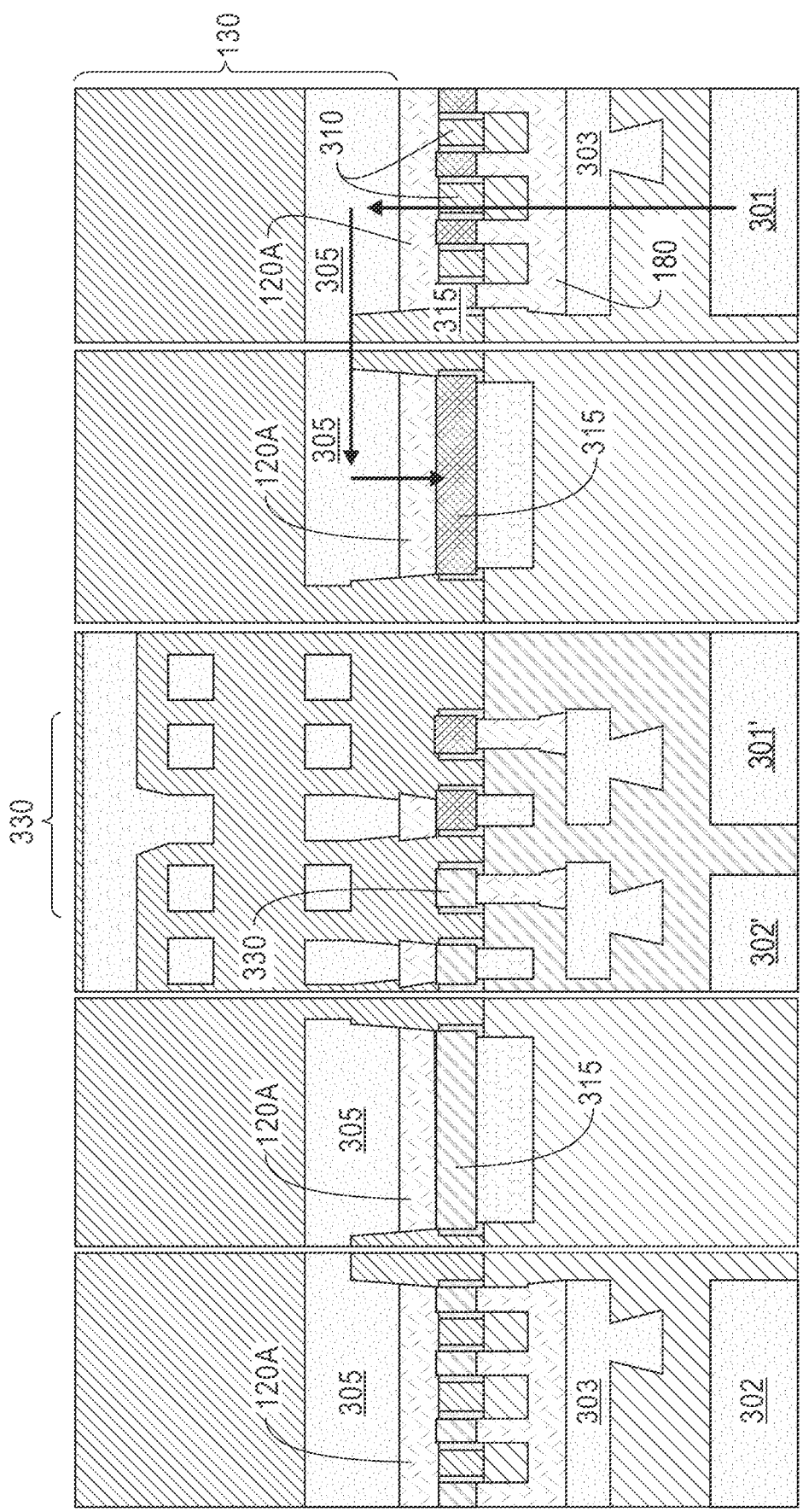

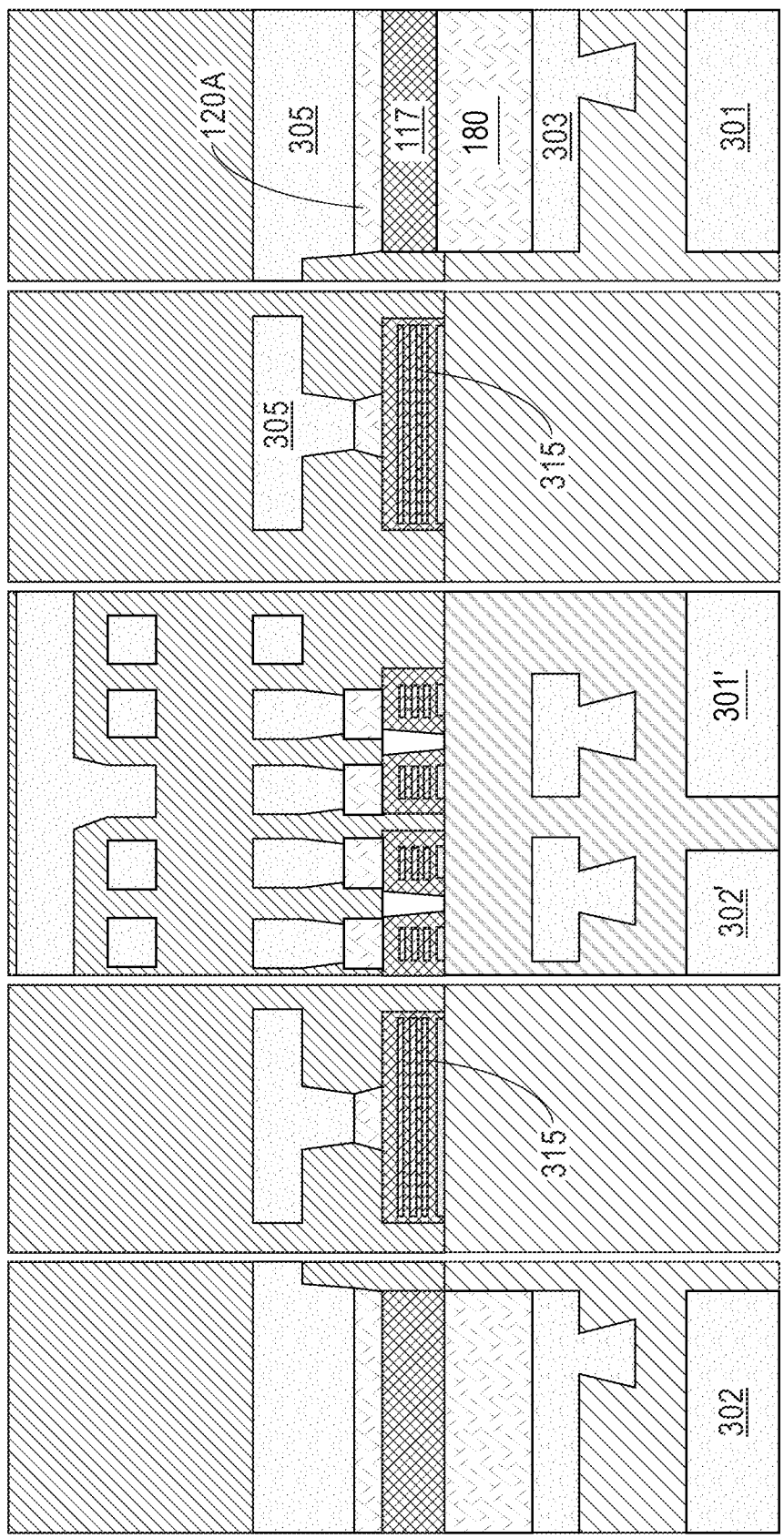

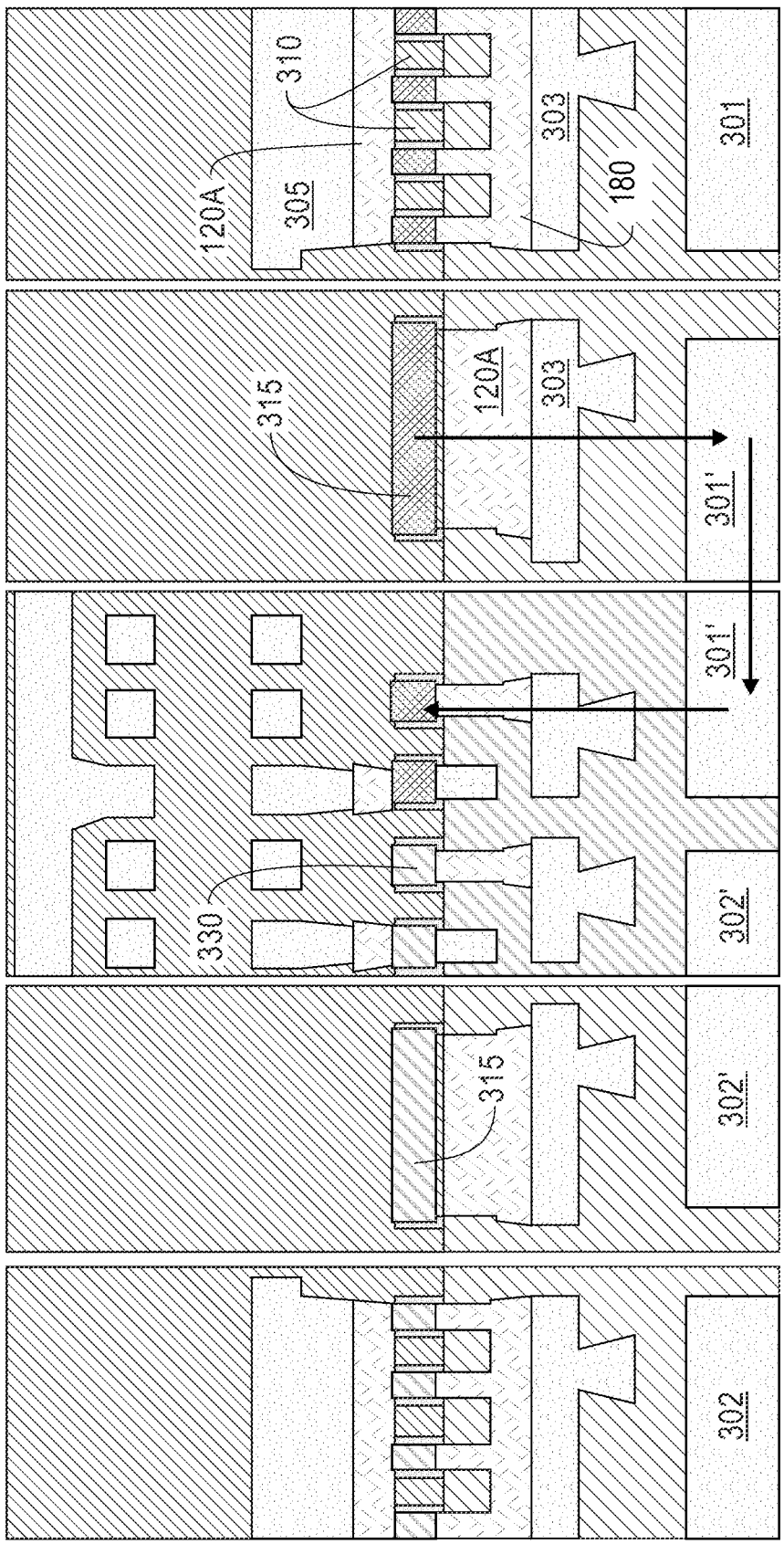

POWER GATING DUMMY POWER TRANSISTORS FOR BACK SIDE POWER DELIVERY NETWORKS

BACKGROUND

Technical Field

The present disclosure generally relates to electrical devices, and more particularly, to power gating dummy power transistors for back side power delivery networks.

Description of the Related Art

Power gating transistors are generally used to disconnect logic cells from the power supply and/or ground to reduce the leakage in the standby mode. When the logic area is disconnected, power consumption is reduced. In one example, a multi-threshold CMOS (MTCMOS) uses low-leakage N-type metal-oxide-semiconductor (NMOS) (or PMOS) transistors as footer (or header) switches to disconnect ground (or power supply) from parts of a design in the circuit standby mode.

Recently, there have been discussions to have power gating transistors on the backside of a semiconductor wafer to couple or decouple the integrated circuit block to or from the power supply. However, fabrication of wafer backside transistors involves extra backside process steps as compared to fabricating gating transistors on the front side of a wafer. Gating transistors may be used to turn off the power supply for certain functional circuits when they are not used, to minimize the leakage current at standby mode. When the functional circuit is in active mode, power gating transistors will turn on the power supply.

One current approach for wafer fabrication provides for direct backside contact schemes. However, the backside contact schemes of present allow power to sometimes flow through. In another wafer fabrication scheme, dummy devices are used for power connections between the back end of line (BEOL) layer and the back side power delivery network (BSPDN) layer. The dummy devices are generally inoperative. In approaches that use dummy devices for power connections, there is generally a lack of power control between the BEOL and the BSPDN, which results in unnecessary power consumption if there is a power leakage at the device region.

SUMMARY

According to an embodiment of the present disclosure, a semiconductor chip device is provided. The semiconductor device includes a substrate with a back end of line layer and a backside power delivery network under the substrate. An input power line is electrically coupled to the backside power delivery network. The substrate also includes analog or digital circuit elements. Dummy transistors are positioned in a circuit with the analog or digital circuit elements. A power gating transistor is positioned in the circuit between the dummy transistors and the analog or digital circuit elements. Power from the power input line is provided from the backside power delivery network, through the dummy transistors, and controlled by the power gating transistor for transfer to the analog or digital circuit elements. The structure of the semiconductor device uses a backside delivery of power to the area of the dummy transistors to transfer power into the analog or digital circuit elements. Backside power delivery has benefits including leaving more of the front side footprint for functional devices. The use of dummy transistors to transfer power from the backside avoids complicated backside formation processes and the need to use other interconnection mechanisms that only serve a role of providing a power connection. Thus, the overall formation process is made easier and space on a semiconductor wafer is used more efficiently. In addition, the gating transistor can close the gate to the analog or digital circuit elements to control power consumption.

In an embodiment, which may be combined with the preceding embodiment, the device includes a connection between the back end of line layer to the power gating transistor. An element in back end of line layer controls an on state or an off state of the gating transistor. In conventional schemes, power usually passes through the back end of the line unchecked to the backside power delivery network regardless of the dummy transistors being used. In the instant device, the back end of the line controls the flow of power through power gating transistor so that the device saves on power consumption when dummy transistors are not being used to connect the back end of the line to the backside power delivery network.

According to an embodiment of the present disclosure, a method of manufacturing a semiconductor device is provided. The method includes forming a layer of analog or digital circuit features on a substrate. Power gating transistors is formed on the substrate. Dummy transistors are formed on the substrate. A back end of line layer is formed on top of the layer of analog or digital circuit features, the power gating transistors and the dummy transistors. A backside power delivery network layer is formed under the analog or digital circuit features layer, the power gating transistors and the dummy transistors. A circuit path is formed from a power input source in the backside power delivery network layer, through the dummy transistors, and through back end of line interconnect electrically coupled to the power gating transistor. Power is transferred from the power gating transistor to the analog or digital circuit features through interconnects at the backside power delivery network, positioned between the power gating transistor and the analog or digital circuit features. As may be appreciated, the method provides controlled power delivery from the back side of the device to analog or digital circuit features through dummy transistors. By using the back side for power delivery, more wafer real estate on the front side can be used for functional components. The dummy transistors, which may be present and serve other roles, provide a convenient connection element from the backside to the gating transistor. In addition, power can be gated when needed and a savings in power consumption in the device becomes possible.

In an embodiment, which may be combined with the preceding embodiments, the method includes forming a connection path from a power terminal at the backside power delivery network, through the dummy transistors, to the back end of line layer, and from the back end of line layer to the power gating transistor and to the backside power delivery network. The feature provides a benefit by routing power from the backside power delivery network, through the dummy transistors, to the back end of line, where the interconnects is coupled to the middle of line contact of the gating transistors, and the gated power is routed back to the backside power delivery network through source/drain backside contact again, where the interconnects at the backside power delivery network is coupled to the analog or digital elements through source/drain backside contact. The feature provides a benefit by shutting off the power to blocks of analog or digital elements that are not in use, by closing the gate of power gating transistor.

According to an embodiment of the present disclosure, a method of manufacturing a controlled power path in a semiconductor device, from a back side to a front side of a wafer with a substrate is provided. The method includes forming a plurality of dummy transistors in a front side to a back side connection region of the wafer. A power gating transistor is formed at a gating transistor region of the wafer. A first dummy placeholder element is formed from placeholder material under a source/drain epitaxial region of the wafer. A second dummy placeholder element is formed under the dummy gate transistors. A back end of line layer and a carrier wafer layer are added to the wafer. The wafer is flipped, and substrate material is removed. Some of the placeholder material is removed from under the first dummy placeholder element, to form a back side to front side connection contact to a power input and ground line, through the dummy transistors and through the power gating transistors. The embodiment makes use of a process that incorporates placeholder elements in areas that are normally filled with substrate. By using placeholders which are removed when the wafer is flipped, contacts from the back side to the front side can be formed so that a back side power input can be used. The resulting structure provides power from the backside to the frontside, with power gated by the gating transistor. So, power is gated to the backside and from the backside to analog or digital element.

In an embodiment, which may be combined with the preceding embodiments, the method includes forming a self-aligned backside contact during the step of removing some of the placeholder material under the first dummy placeholder elements. The resulting self-aligned backside contact makes manufacturing easier and the end product more reliable.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 1A-1C are cross-sectional views of a source, a gate, and a drain of a semiconductor device according to an embodiment.

FIG. 3A is a side view of a wafer block depicting an initial foundation in a method of manufacturing a semiconductor device, according to embodiments.

FIGS. 3B and 3C show two views of a nanosheet patterning of the wafer block in FIG. 3A, according to an embodiment.

FIGS. 5A-5G show different areas of the wafer in a front end of line formation process, according to an embodiment.

FIGS. 6A-6H show views consistent with the views of FIGS. 5A-5G in a middle of the line (MOL) contact formation, according to an embodiment.

FIGS. 7A-7H show views in forming a back end of line layer and a carrier wafer, according to an embodiment.

FIGS. 8A-8H show views consistent with the views of FIGS. 7A-7H, in flipping the wafer over, according to an embodiment.

FIGS. 9A-9H show views consistent with the views of FIGS. 8A-8H, in removing a silicon substrate layer, according to an embodiment.

FIGS. 10A-10H show views consistent with the views of FIGS. 9A-9H, in removing an etch stop layer, removing the remaining substrate layer, interlevel dielectric deposition and chemical mechanical planarization, according to an embodiment.

FIGS. 11A-11H show views consistent with the views of FIGS. 10A-10H, in a backside contact patterning, according to an embodiment.

FIGS. 12A-12H show views consistent with the views of FIGS. 11A-11H, in selectively removing placeholder material, according to an embodiment.

FIGS. 13A-13H show views consistent with the views of FIGS. 12A-12H, in metallizing the backside of the wafer, according to an embodiment.

FIGS. 14A-14H show views consistent with the views of FIGS. 13A-13H, in forming a backside power delivery network, according to an embodiment.

FIGS. 15A-15E show detail views of the connection architecture from backside power delivery network areas to back end of line through dummy resistors, from the back end of line to the backside power delivery network through power gating transistors, and from the backside power delivery network to analog or digital elements from a source/drain cross-section of dummy transistors, power gating transistors and analog or digital elements, according to an embodiment.

FIGS. 16A-16E show detail views of the connection architecture from backside power delivery network areas to back end of line through dummy transistors, from the back end of line to the backside power delivery network through power gating transistors, and from the backside power delivery network to analog or digital elements along gate cross-section of dummy transistors, power gating transistors and analog or digital elements, according to an embodiment.

FIGS. 17A-17E show detail views of the connection architecture from backside power delivery network areas to back end of line through dummy transistors, from the back end of line to the backside power delivery network through power gating transistors, and from the backside power delivery network to analog or digital elements from a source/drain cross-section of dummy transistors, power gating transistors and analog or digital elements, according to an embodiment.

DETAILED DESCRIPTION

Overview

Figure 2A:
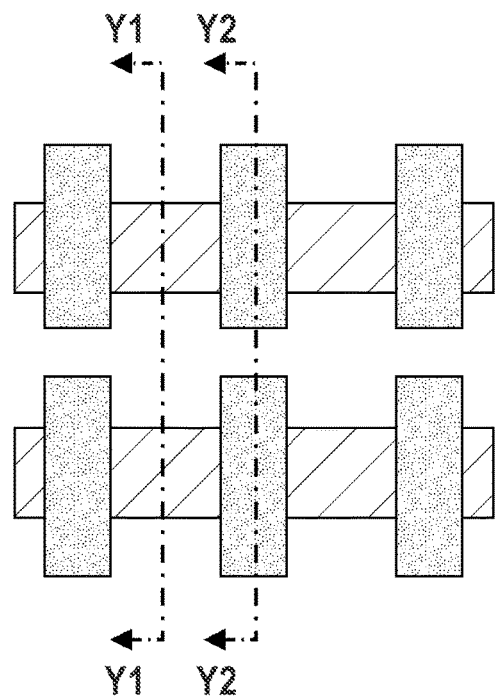
FIGS. 2A-2C are legends mapping cross-sectional views of the semiconductor device of FIGS. 1A-1C to perspectives of the semiconductor device shown in FIGS. 3A-17E.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate. In the disclosure herein, the "first surface" may be the top layer of a semiconductor device where individual circuit devices are patterned in the semiconductor material. The "first surface" in the context discussed may also be called the "front side" or "front end of line" (FEOL) of the device. The "header" of the device may be based on which side of the device includes the high side voltage line (Vdd). The "footer" includes the low side voltage ($V_{SS}$).

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Device Structure

Reference is now made to FIGS. 1A-1C where a semiconductor device 100 (sometimes referred to as the "device 100") is shown according to an embodiment. The device 100 provides power gating of dummy transistors for a back side of the wafer power delivery network. For sake of illustration, FIGS. 1A-1C show only three cross-sectional areas of the device 100 where features that provide the gating function are positioned. FIG. 1A shows a cross-section of the source side. FIG. 1B shows a cross-section of the gate side. FIG. 1C shows a cross-section of the drain side. The labels Y3, Y4, and Y5 refer to cross-section axes that are referenced throughout the drawings to provide an indicator of which perspective of the device (source, gate or drain) is being shown. Details of the cross-section axes are discussed just below in FIGS. 2A-2C.

In general, embodiments of the device 100 include a power gating transistor 315 positioned between the back end of the line layer 130 and the backside power delivery network 150. A carrier wafer layer 135 is shown as a reference point, for example, which may be positioned on the side of the device 100 opposite the backside power delivery network 150. As will be appreciated, the device 100 includes structure that defines a controlled power path. The structure uses power gating transistors 315 to control power through dummy transistors (shown in detail further below), which may be processed with a built-in power conduction function from the wafer backside power input to wafer front side back end of line. Embodiments generally include the positioning of the gating transistor(s) 315 on the same layer as dummy transistors and logic circuit elements/devices. By using the dummy transistors, which occupy a large percentage of wafer real estate, to conduct power through the wafer, the area needed to conduct power (for example, by using a micro through silicon via (uTSV) is greatly reduced. As one benefit to the proposed structure, the logic device density can be increased resulting in more powerful chip devices. Also, using a power gating transistor in combination with dummy transistors may reduce power consumption by shutting off the current to blocks of the circuit that are not in use.

Figure 2B:
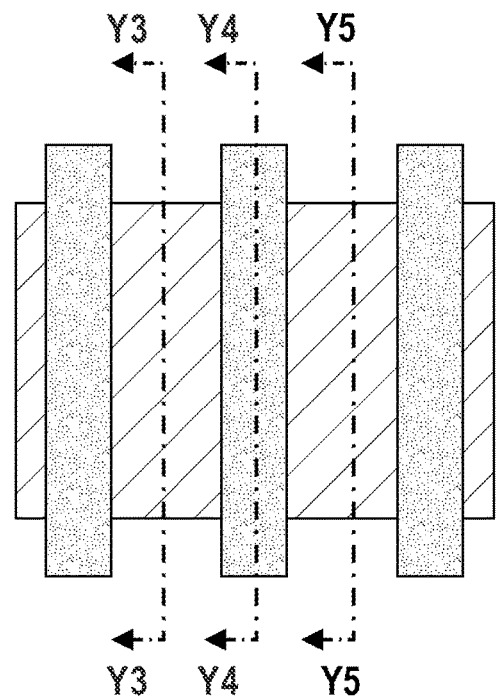
Figure 2C:
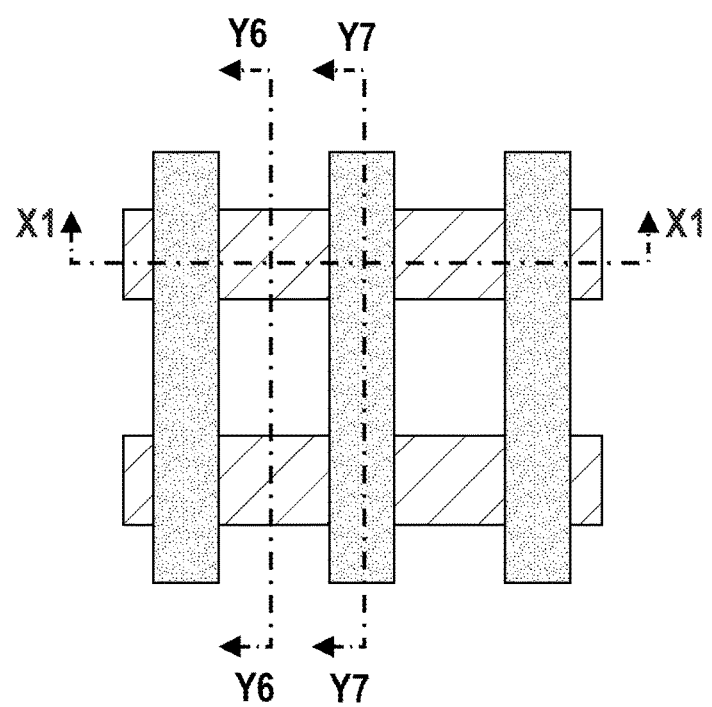

FIGS. 2A-2C show a legend of cross-section views for areas of the device 100. The figures that follow will show the device 100 from different perspectives and will include sections of standard logic device areas (FIG. 2A), power gating transistor areas (FIG. 2B) and dummy transistor area (FIG. 2C). The power gating transistor areas include header (PMOS) and footer (NMOS) sections that include structure that provides the controlled power path from the backside power delivery network to the logic device or circuit elements. Since the device 100 (and its formative steps) includes many elements that can appear different depending on the perspective, one should constantly refer back to FIGS. 2A-2C to track the perspectives being shown.

FIG. 2A represents the cross-sectional areas for standard digital or analog device elements in the device 100. FIG. 2B represents the cross-sectional areas for a power gating transistor. The power gating transistor width (for example, approximately equal to 80 nm or greater) of the subject device is longer than a standard logic device so that the threshold voltage (VT) is higher than in a standard logic device. Comparing the width of the power gating transistor in FIG. 2B to the width of the device in the area of FIG. 2A, the width of the power gating transistor in 2B is much larger. FIG. 2C represents the cross-section of the dummy devices used to connect the backside end of line to the backside power delivery network.

In the description that follows, the figures will sometimes be referenced back in correlation to FIGS. 2A-2C so that there is an understanding of where fabrication in the device is being performed relative to standard logic device elements, power gating transistor elements, dummy transistor elements and those elements that are the subject of the current disclosure. The device features in the sections related to FIG. 2B are the features of interest for the subject disclosure. For example, axis "Y3" represents the cross-section along the source side of the device. Axis "Y4" represents the cross-section along the gate side of the device. Axis "Y5" represents the cross-section along the drain side of the device.

Example Methodology of Manufacture

Reference is now made beginning at FIGS. 3 and 4A through FIG. 17E to describe by illustration, a method for manufacturing a semiconductor device that includes power gating of dummy transistors for a back side of the wafer power delivery network. The figures show a wafer fabrication process including additive and subtractive processes to form some circuit elements in the end device. The additive and subtractive processes involved (for example, masking, depositing, etching, lithography, etc.,) may be known to those of skill in the art and will not necessarily be identified in each act shown. The fabrication of the devices described herein can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, a device can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (ME), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit. In some figures, some reference numerals for elements not being affected by a step may not be repeated.

The FIGS. 3A-17E are shown along different axes of perspective and different cross-sectional views. FIGS. 3A-17E should be viewed with constant reference back to FIGS. 2A-2C.

Referring now to FIG. 3A, a device 100 is formed initially including semiconductor material 105 (for example, silicon (Si), silicon-germanium (SiGe), silicon carbide (SiC), or III-V compound semiconductor material (e.g., gallium-arsenide (GaAs)) may include a buried oxide or silicon germanium layer 110 epitaxially grown onto the semiconductor material 105. Layer 110 will be used as an etch stop layer further into the process. A bottom sacrificial layer of 107, alternating active semiconductor layers 103, and sacrificial layers 109 may be added to the semiconductor material 105. The structure shown in FIG. 3A may represent a starting block for fabrication. In various embodiments, the active semiconductor layer 103 can be the same semiconductor material as the semiconductor material 105 or a different semiconductor material formed on the buried layer 110, for example, a semiconductor material epitaxially grown on a buried silicon germanium partition layer. In various embodiments, the sacrificial layers 109 can be silicon-germanium (SiGe) layers having a germanium concentration sufficient to allow selective etching and removal relative to the bottom sacrificial layer 107 and the active semiconductor layer 103. In various embodiments, the bottom sacrificial layer 107 can be silicon-germanium (SiGe) layers having a germanium concentration sufficient to allow selective etching and removal relative to the semiconductor material 105, the sacrificial layers 109 and the active semiconductor layer 103. In various embodiments, the bottom sacrificial layer 107 can be silicon-germanium (SiGe) layer having a germanium concentration of greater than 50 atomic percent (at. %), whereas the sacrificial layers 109 can be silicon-germanium (SiGe) layer having a germanium concentration of less than 40 at. %.

Figure 4A:
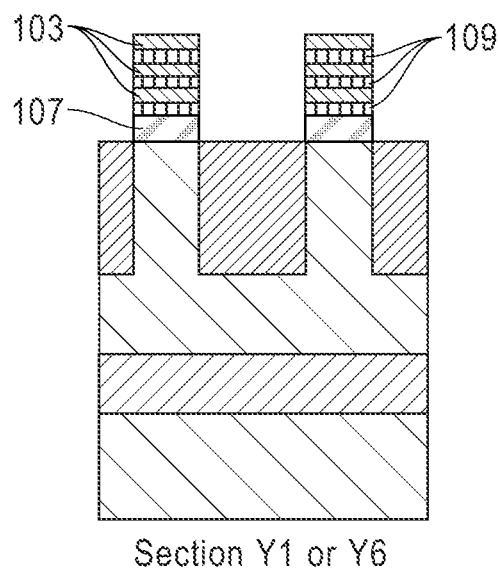
FIGS. 4A and 4B show two views of a shallow trench isolation, according to an embodiment.
Figure 4B:
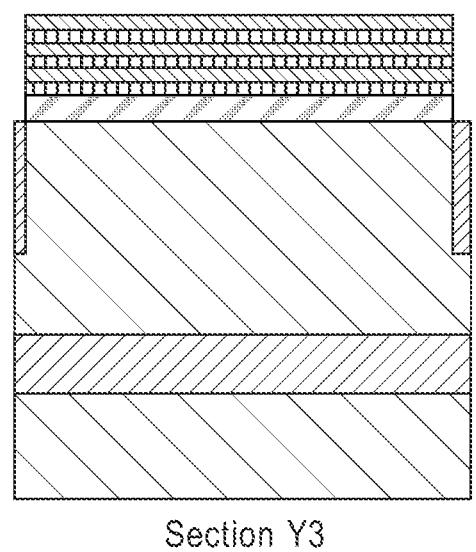

FIGS. 3B and 3C show nanosheet patterning of the wafer. A hard mask layer 112 may be placed over the areas of the wafer to protect from removal of material. The act produces power gating transistor area with a gate length that is longer than a standard logic device area gate length. FIG. 3B represents nanosheet patterning in the standard logic device area and for a standard channel length in the dummy transistor fabrication area. FIG. 3C represents patterning in the power gating transistor area, which shows a width (gate length) larger than the widths represented in FIG. 3B. FIGS. 4A and 4B show a step of shallow trench isolation (STI) 114 that fills openings created in the previous nanosheet patterning.

Figures 5D, 5E, 5F, 5G:
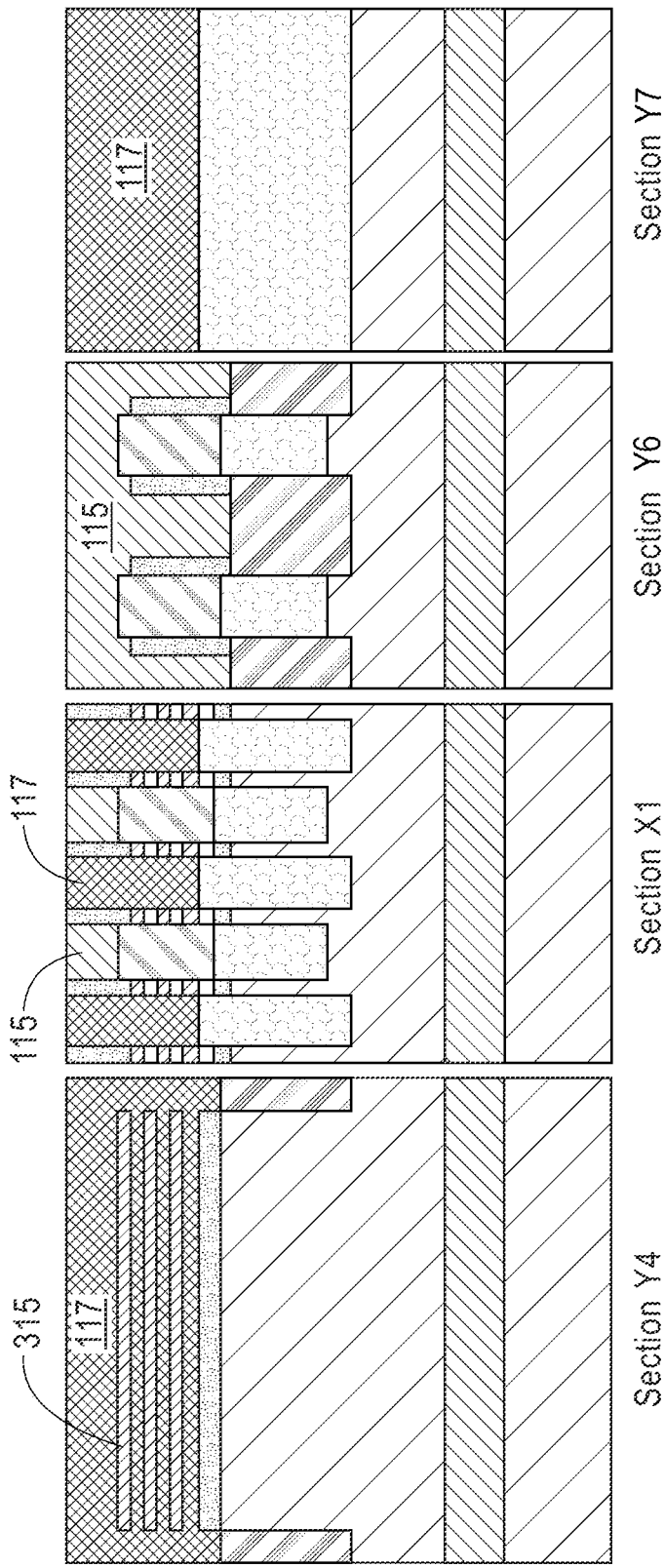

FIGS. 5A-5H show different areas of the wafer in a front end of line process step. FIG. 5A represents the standard device logic (with logic circuit devices 330) along the "Y1" cross-section axis of FIG. 2A. FIG. 5B represents the standard device logic along the "Y2" cross-section axis of FIG. 2A. FIG. 5C represents the power gating transistor section along the "Y3" cross-section axis of FIG. 2B. FIG. 5D represents the power gating transistor section along the "Y4" cross-section axis of FIG. 2B. Emphasis will be given to the fabrication in the areas of Y3, Y4 and Y5 where a gating structure is being developed to power the backside of the wafer through the dummy transistor section. FIG. 5E represents the dummy transistor section along the "X1" cross-section axis of FIG. 2C. FIG. 5F represents the dummy transistor section along the "Y6" cross-section axis of FIG. 2C. FIG. 5G represents the dummy transistor section along the "Y7" cross-section axis of FIG. 2C. In the step, a layer of interlevel dielectric 115 is deposited in areas as shown (visible in FIGS. 5A, 5C, 5E, and 5F). Some areas may receive a high-K metal gate 117 material (visible in FIGS. 5B, 5D, 5E, and 5G).

FIGS. 6A-6H show a fabrication that includes a middle of line contact (MOL) formation. It should be noted that the view along Y3 and Y5 begin to look different as the process opens the middle of line source/drain contact area along Y3. Accordingly, the figures add another view Y5 so that the perspective from both sides of the Y3 and Y5 are shown. In the contact formation step of FIGS. 6A-6H, a source/drain contact 120A is formed in connection with interconnects in the back end of line. A gate contact 120B is formed in connection with interconnects in the back end of line. The placeholder 125 is a feature that is not germane to the subject invention. A gate cut opening 122 is shown in FIG. 6B as a point of reference. In the area of the dummy transistors, FIGS. 6F-6H, all of the contacts 120A and 120B may be patterned/opened during MOL process including for example, MOL metal contacts all gate and S/D of dummy transistors.

FIGS. 7A-7H show a step of fabrication for forming a back end of line layer and a carrier wafer. A back end of line layer 130 is formed over the MOL source/drain contacts 120A and MOL gate contacts 120E and the interlevel dielectric 115. A carrier wafer layer 135 may be formed over the back end of line layer 130. In FIG. 7A, 7C, 7E, 7F, 7G, 7H, some embodiments may include placeholder 125 material under a source/drain (S/D) epitaxial region 355 and a gate region 325.

FIGS. 8A-8H show a flipping the wafer. As can be seen, the semiconductor 105 layer (which may be for example, a layer of silicon) and the buried oxide or silicon germanium layer 110 are now on top. The carrier wafer layer 135 is now on the bottom.

FIGS. 9A-9H show removing the semiconductor 105 up to an etch stop layer. The buried oxide or silicon germanium layer 110 serves the role of the etch stop layer.

FIGS. 10A-10H show removing the etch stop layer 110 and the layer of semiconductor 105 layer below the etch stop layer 110. After the underlying semiconductor 105 is removed, the open areas may be backfilled with a backside interlevel dielectric 115, followed by chemical mechanical planarization.

FIGS. 11A-11H show a backside contact patterning. In the area of the standard logic device (FIGS. 11A-11B), an area 140 may be patterned (dielectric removed) to expose the placeholder 125 of source/drain area. In the area of the power gating transistor, (FIGS. 11C-11E), the source side of the placeholder 125 may remain covered. In FIG. 11E, the process may remove the dielectric 115 to expose the drain side of the placeholder 125 on the wafer backside. In the dummy transistor section (FIGS. 11F-11H), to conduct power through the area, the dielectric 115 may be removed exposing all the placeholders 125 of conductive elements. The elements exposed in FIGS. 11A-11H also include shallow trench isolation 114.

FIGS. 12A-12H show selectively removing placeholder 125 material. The placeholder 125 material may be removed where exposed by using for example, a wet process. The selective removal of placeholder material may temporarily expose elements including for example, shallow trench isolation 114.

FIGS. 13A-13H show a metallizing the backside of the wafer. The spaces exposed by the placeholder 125 removal and area 140 may be backfilled with a contact metal 180. For example, in the dummy transistor area (FIGS. 13F-13H), all the openings are backfilled so that the future BSPDN and the back end of line layer 130 will have a direct contact path. In the power gating transistor area, (FIGS. 13C-13E), one side of the source of the gating transistor area connects to the back end of the line through a MOL source/drain contact 120A (FIG. 13C) while the drain is connected to the BSPDN by backside contact metal 180 (FIG. 13E). In the standard logic device region, (FIGS. 13A-13B), a source/drain of the standard logic device is connected to BSPDN by backside contact metal 180. As may be appreciated, the structure now provides control for power between the backside power delivery network of standard logic region and the back end of line of dummy transistor. Power consumption may be halted by the gating transistor area so that power is not provided to the standard logic device region when unnecessary.

FIGS. 14A-14H show formation of a backside power delivery network. The backside power delivery network delivers power from power terminals (Vdd, $V_{SS}$) to the back end of line through the direct contact path that includes in the dummy transistor area, and the power from back end of line is gated by the power gating transistor area. The gated power is delivered to the standard logic area through the backside contact metal 180 and backside power delivery network between power gating transistor and standard logic device area.

FIGS. 15A-15E, 16A-16E, and 17A-17E show cross source/drain, gate and source/drain cross-section, respectively, of the front end of line, back end of line and backside power delivery network of semiconductor device 100, with more focus on the interconnect details of back end of line and backside power delivery network as well as how power is gated by power gating transistor and how the gated power is transferred to the standard logic device region FIGS. 15A-15E, 16A-16E, and 17A-17E therefore uses power gating transistor axis in FIG. 2B to show different perspective of the structures of dummy transistor area and logic device region, e.g. cross source, drain or gate perspectives. The "A" and "E" drawings of each figure series show the dummy transistor areas used to connect the back end of the line to the backside power delivery network. Figure "B" of each series shows the power gating transistor footer area (NMOS) perspective. Figure "C" of each series shows the standard logic device region. Figure "D" of each series shows the power gating transistor header area (PMOS) perspective.

Referring now to FIGS. 15A-15E, the FIG. 15B, FIG. 15D are shown from the perspective of the Y3 axis of the source/drain of power gating transistor footer and header, respectively. FIG. 15A and FIG. 15E are shown from the source/drain perspective of dummy transistor region. FIG. 15C is shown from the source/drain perspective of the standard logic device region. In the series of figures shown here, focus is placed on the elements of the power gating transistor 315 which are positioned in the header and footer sections (FIGS. 15B and 15D). For the header or footer to gate power, the power passes between the back end of the line and backside power delivery network of the header or footer. In the embodiments of the subject device, the power gating transistors 315 are positioned in a path between the dummy transistors 310 and the logic circuit devices 330. The logic circuit devices 330 may be analog or digital. The high side of the voltage input ($V_{DD}$) 301 is situated in the header side of the area used to connect to the backside power delivery network (FIG. 15E). The low side voltage input ($V_{SS}$) 302 is positioned in the footer side of the area used to connect to the backside power delivery network (FIG. 15A). FIG. 15C shows the inputs of the virtual high side voltage ($V_{DD}'$) 301' and virtual low side voltage ($V_{SS}'$) 302' for PMOS and NMOS, respectively, after power gated by power gating transistors header and footer. In operation, power from the voltage source 301, 302 is conducted through backside power delivery network layers 303 through a backside contact metal 180 into the dummy transistors 310. Power continues through another metal contact 120A into a level 1 metal layer 305 at back end of line. The level 1 metal layer 305 may be in direct contact with the header elements as shown in FIG. 15D, or may be in direct contact with the footer elements as shown in FIG. 15B. FIG. 15E, FIG. 15D shows an example of power flow indicated by arrows. The power may continue through another contact metal 120A into the source side power gating transistor 315. The power gating transistor 315 controls whether to allow power to pass into the standard logic circuit devices 330.

Referring now to FIGS. 16A-16E, the FIG. 16B, FIG. 16D are shown from the perspective of the Y4 axis of the gate of power gating transistor footer and header, respectively. FIG. 16A and FIG. 16E are shown from the gate perspective of dummy transistor region. FIG. 16C is shown from the source/drain perspective of the logic device region. As can be seen from the gate side of the device, power flow through FIG. 16A and FIG. 16E is similar to the power flow in FIG. 15A and FIG. 15E, except that the power passes through a high-k metal gate 117. In addition, when the power reaches the level 1 metal layer 305, the power is physically disconnected from the level 1 metal layer 305 of power gating transistor footer ad header, as shown in FIG. 16B and FIG. 16D. See at FIG. 16B and FIG. 16D where the level 1 metal layer 305 provides signal (on or off) to the gate of the power gating transistor 315 footer and header. This arrangement provides control of the power at the gate side of the power gating transistor 315. The gate side of the power gating transistor may be controlled separately by the back end of the line. The gate side of the power gating transistor 315 controls whether or not power flows into the logic circuit devices 330 by being turned on or off.

Referring now to FIGS. 17A-17E, the FIG. 17B, FIG. 17D are shown from the perspective of the Y5 axis of the source/drain of power gating transistor footer and header, respectively. FIG. 17A and FIG. 17E are shown from the source/drain perspective of dummy transistor region. FIG. 15C is shown from the source/drain perspective of the logic device region. When the gate of the power gating transistor is on, the power at the power gating transistor 315 (FIG. 17B, FIG. 17D) is transferred to the backside power delivery layers 303, converting the input power to virtual power through the virtual power line ($V_{SS}'$) 302' and ($V_{DD}'$) 301' (FIG. 17B, FIGS. 17C and 17D) and into the logic circuit devices 330 (FIG. 17C). FIG. 17E, FIG. 17D shows an example of power flow indicated by arrows.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor chip device, comprising:
    a substrate;
    a back end of line layer on the substrate;
    a backside power delivery network under the substrate;
    an input power line electrically coupled to the backside power delivery network;

a plurality of analog or digital circuit elements on the substrate;

one or more dummy transistors positioned in a circuit with the plurality of analog or digital circuit elements; and a power gating transistor positioned in the circuit between the one or more dummy transistors and the plurality of analog or digital circuit elements, wherein power from the input power line is provided from the backside power delivery network, through the one or more dummy transistors, and controlled by the power gating transistor for transfer to the plurality of analog or digital circuit elements.

2. The semiconductor chip device of claim 1, further comprising a connection between the back end of line layer to the power gating transistor, wherein an ON state or an OFF state of the power gating transistor is controlled by an element in the back end of line layer.

3. The semiconductor chip device of claim 1, wherein the power gating transistor is located on a same layer as the one or more dummy transistors.

4. The semiconductor chip device of claim 3, wherein the one or more dummy transistors are located on the substrate.

5. The semiconductor chip device of claim 1, wherein the back end of line layer is positioned on a front side of the substrate, on a side of the substrate opposite the backside power delivery network.

6. The semiconductor chip device of claim 1, further comprising a metal gate and a direct source/drain contact, wherein the power from the power input line is connected to the back end of line layer through the direct source/drain contact and through the metal gate.

7. The semiconductor chip device of claim 6, wherein the power gating transistor is configured to convert the power from the back end of line layer to virtual power provided to the backside power delivery network, through the direct source/drain contact.

* * * * *